US010983233B2

(12) United States Patent
Maucec et al.

(10) Patent No.: US 10,983,233 B2
(45) Date of Patent: Apr. 20, 2021

(54) METHOD FOR DYNAMIC CALIBRATION AND SIMULTANEOUS CLOSED-LOOP INVERSION OF SIMULATION MODELS OF FRACTURED RESERVOIRS

(71) Applicant: Saudi Arabian Oil Company, Dhahran (SA)

(72) Inventors: Marko Maucec, Englewood, CO (US); Otto E. Meza Camargo, Dhahran (SA); Babatunde Moriwawon, Khobar (SA); Ali A. Taiban, Khobar (SA)

(73) Assignee: Saudi Arabian Oil Company, Dhahran (SA)

( * ) Notice: Subject to any disclaimer, the term of this patent is extended or adjusted under 35 U.S.C. 154(b) by 129 days.

(21) Appl. No.: 16/351,233

(22) Filed: Mar. 12, 2019

(65) Prior Publication Data
US 2020/0292722 A1 Sep. 17, 2020

(51) Int. Cl.
*G01V 1/28* (2006.01)
*G06F 30/20* (2020.01)
*G01V 1/30* (2006.01)

(52) U.S. Cl.
CPC .............. *G01V 1/282* (2013.01); *G01V 1/302* (2013.01); *G01V 1/306* (2013.01); *G06F 30/20* (2020.01)

(58) Field of Classification Search
CPC ........ G01V 1/282; G01V 1/302; G01V 1/306; G06F 30/20
See application file for complete search history.

(56) References Cited

U.S. PATENT DOCUMENTS

| 8,274,859 B2 | 9/2012 | Maucec |
| 8,392,165 B2 | 3/2013 | Maucec et al. |
| 8,507,868 B2 | 8/2013 | Maucec |

(Continued)

FOREIGN PATENT DOCUMENTS

WO 2018151707 8/2018

OTHER PUBLICATIONS

Oliver et al. "Recent progress on reservoir history matching: a review". DOI 10.1007/s10596-010-9194-2. Comput Geosci (2011) p. 185-221. (Year: 2011).*

(Continued)

*Primary Examiner* — Eunhee Kim
(74) *Attorney, Agent, or Firm* — Fish & Richardson P.C.

(57) ABSTRACT

Systems and methods for generating a fractured reservoir model include: receiving a seismic dataset of a surveyed subsurface; identifying a dynamic response of each parameter; selecting a subset of parameters from the set of parameters based on the dynamic response of each parameter; sampling an outer boundary of a parameter uncertainty domain; adjusting the range of values associated with each parameter of the subset based on the sampling; generating a geo-model based on the adjusted range of values associated with each parameter of the subset; generating a discrete fracture network model based on the geo-model; generating a scenario of a simulation model based on the discrete fracture network model and the geo-model; performing a forward simulation based on the scenario of the simulation model; determining that a misfit of the forward simulation is below a threshold by evaluating an objective function; and producing a model based on the forward simulation.

20 Claims, 20 Drawing Sheets

(56) References Cited

U.S. PATENT DOCUMENTS

| | | |
|---|---|---|
| 8,619,499 B2 | 12/2013 | Maucec |
| 8,920,029 B2 | 12/2014 | Maucec |
| 9,026,416 B2 | 5/2015 | Mallison et al. |
| 9,069,916 B2 | 6/2015 | Sarma et al. |
| 9,081,918 B2 | 7/2015 | Yarus et al. |
| 9,157,319 B2 | 10/2015 | Yarus et al. |
| 9,208,268 B2 | 12/2015 | Fung |
| 9,223,042 B2 | 12/2015 | Maucec et al. |
| 9,260,948 B2 | 2/2016 | Maucec |
| 9,330,064 B2 | 5/2016 | Maucec |
| 9,646,414 B2 | 5/2017 | Maucec |
| 9,732,592 B2 | 8/2017 | Carvajal et al. |
| 9,753,181 B2 | 9/2017 | Gorell et al. |
| 9,779,060 B2 | 10/2017 | Maucec |
| 9,898,560 B2 | 2/2018 | Hinkley et al. |
| 9,952,351 B2 | 4/2018 | Kuznetsov et al. |
| 10,108,762 B2 * | 10/2018 | Feger .................... G06F 30/20 |
| 2010/0076738 A1 | 3/2010 | Dean et al. |
| 2010/0138196 A1 | 6/2010 | Hui et al. |
| 2011/0257944 A1 * | 10/2011 | Du ........................ E21B 43/267 703/2 |
| 2012/0232865 A1 * | 9/2012 | Maucec .................. G06F 17/18 703/2 |
| 2015/0032431 A1 | 1/2015 | Shi et al. |
| 2015/0039276 A1 | 2/2015 | Maucec |
| 2015/0286950 A1 | 10/2015 | Kang |
| 2015/0286954 A1 | 10/2015 | Maucec et al. |
| 2016/0004800 A1 | 1/2016 | Singh et al. |
| 2016/0047943 A1 | 2/2016 | Maucec et al. |
| 2016/0131801 A1 | 5/2016 | Singh et al. |
| 2016/0138371 A1 | 5/2016 | Loaiza et al. |
| 2016/0139298 A1 | 5/2016 | Singh et al. |
| 2016/0168959 A1 | 6/2016 | Yarus et al. |
| 2016/0170087 A1 | 6/2016 | Yarus et al. |
| 2016/0187533 A1 | 6/2016 | Maucec et al. |
| 2016/0259088 A1 * | 9/2016 | Carvajal ................ E21B 41/00 |
| 2016/0312607 A1 * | 10/2016 | McNealy ............ E21B 41/0092 |
| 2016/0326845 A1 * | 11/2016 | Djikpesse ............... E21B 49/00 |
| 2017/0003694 A1 | 1/2017 | Carvajal et al. |

OTHER PUBLICATIONS

Jamshidnezhad, "3. Experimental Design in Reservoir Engineering, 3.5 Experimental design, 3.5.3.3 Planckett-Burman design, 3.5.3.5 Latin hypercube design," Experimental Design in Petroleum Reservoir Studies, 2015, 42 pages.

Maucec et al., "Engineering Workflow for Probabilistic Assisted History Matching and Production Forecasting: Application to a Middle East carbonate Reservoir," SPE-165980-MS, Society of Petroleum Engineers, Sep. 2013, 21 pages.

Sarma and Aziz, "New Transfer Functions for Simulation of naturally Fractured Reservoirs with Dual-Porosity Models," SPE 90231-PA, Society of Petroleum Engineer Jounral, vol. 11, No. 3, Sep. 2006, 16 pages.

Schulze-Riegert and Ghedan, "Modern Techniques for History Matching," presented at the 9th International Forum on Reservoir Simulations, Dec. 9-13, 2007, 50 pages.

Schulze-Riegert et al., "Scalability and Performance Efficiency of History Matching Workflows Using MCMC and Adjoint Techniques Applied to the North Sear reservoir Study," SPE-180105-MS, Society of Petroleum Engineers, May 31, 2016, 20 pages.

Friedmann et al., "Assessing uncertainty in channelized reservoirs using experimental designs," presented at the SPE Annual Technical conference and exhibition, New Orleans, Louisiana, Sep. 30, 2001; Society of Petroleum Engineers, 2001, 15 pages.

Kassenov et al., "Efficient workflow for assisted history matching and brownfield design of experiments for the tengiz field," SPE-172329, presented at the SPE Annual Caspian Technical Conference and Exhibition, Astana, Kazakhstan, Nov. 12-14, 2014; Society of Petroleum Engineers, 2014, 11 pages.

PCT International Search Report and Written Opinion in International Appln. No. PCT/US2020/021671, dated Jun. 24, 2020, 15 pages.

* cited by examiner

TO FIG. 4B

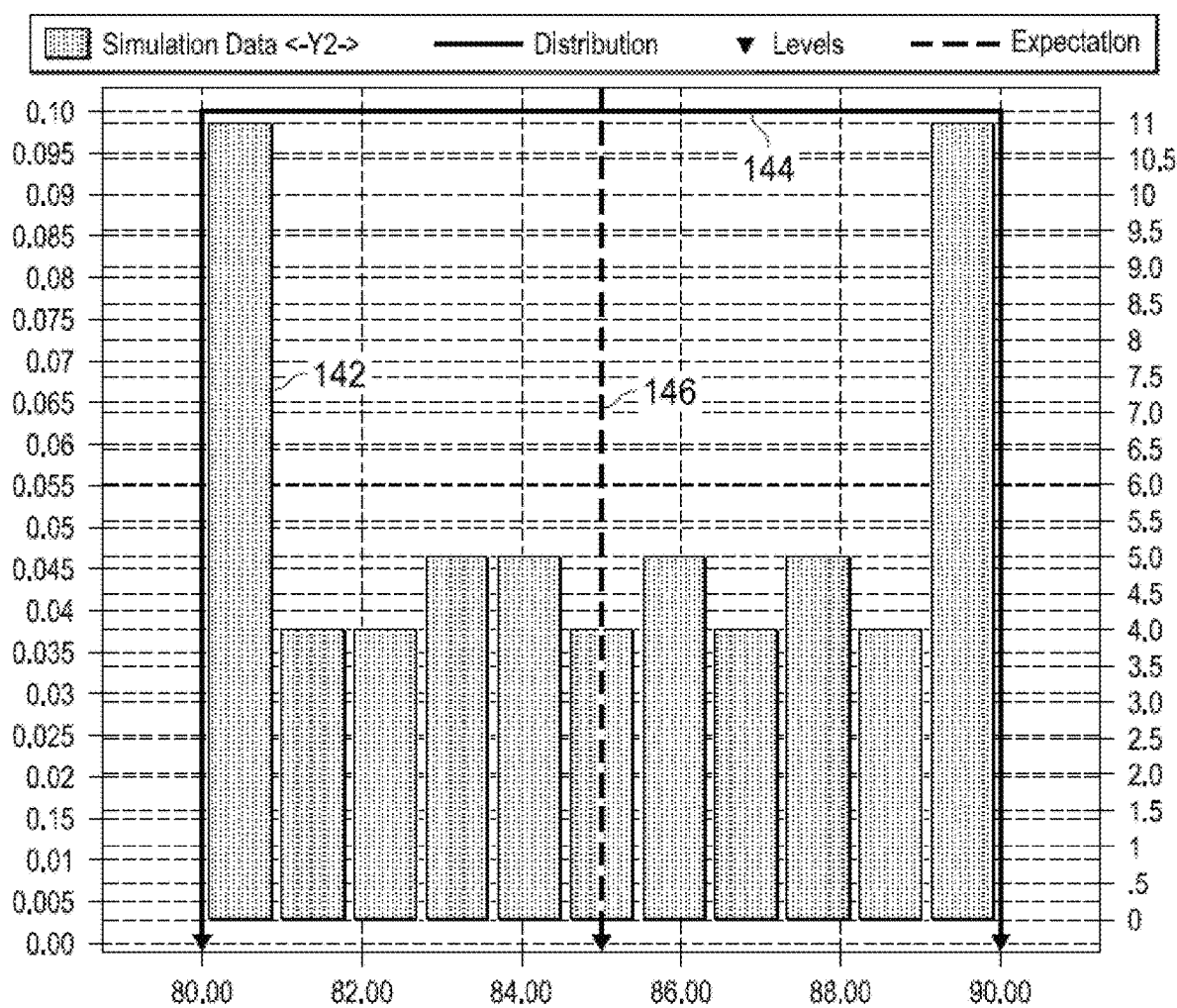

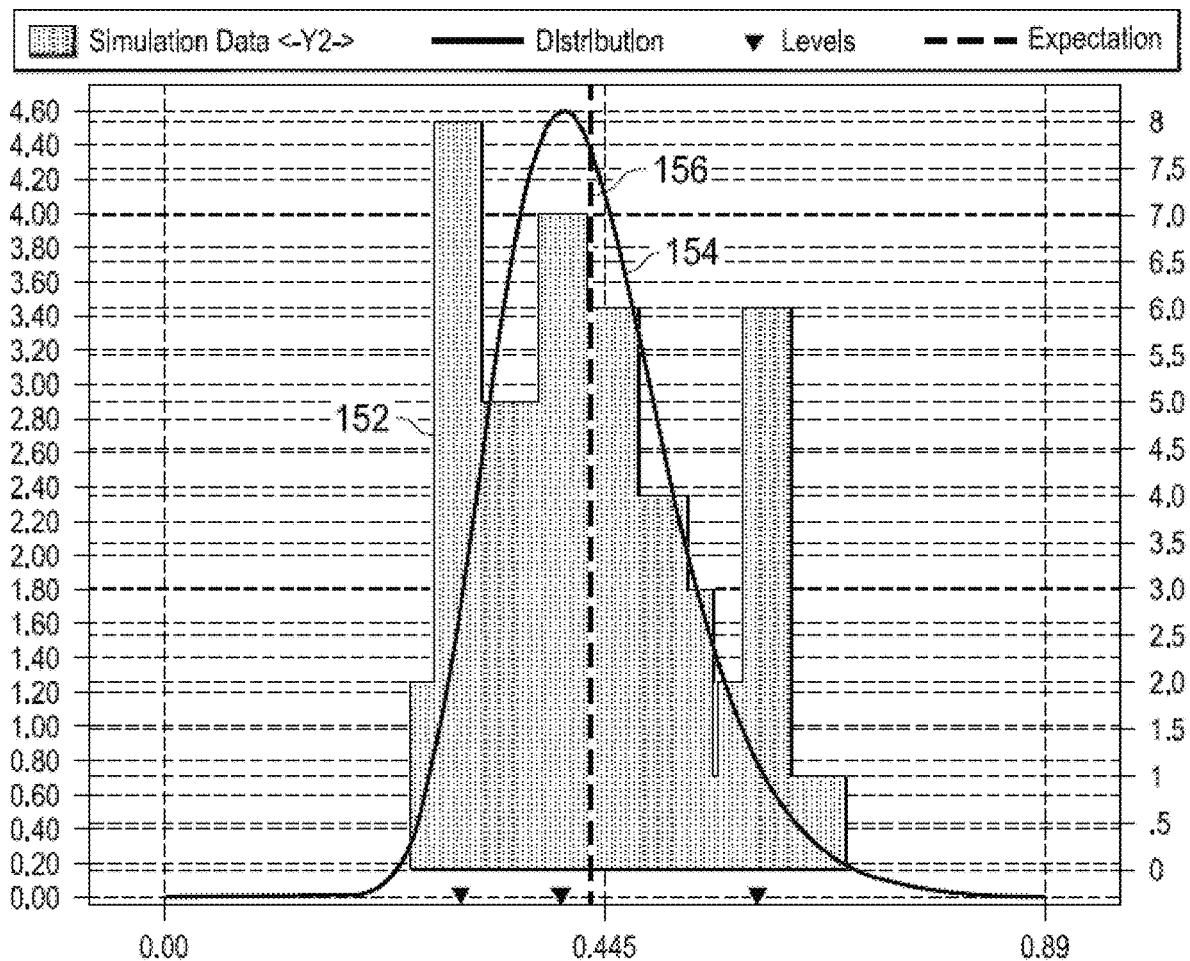

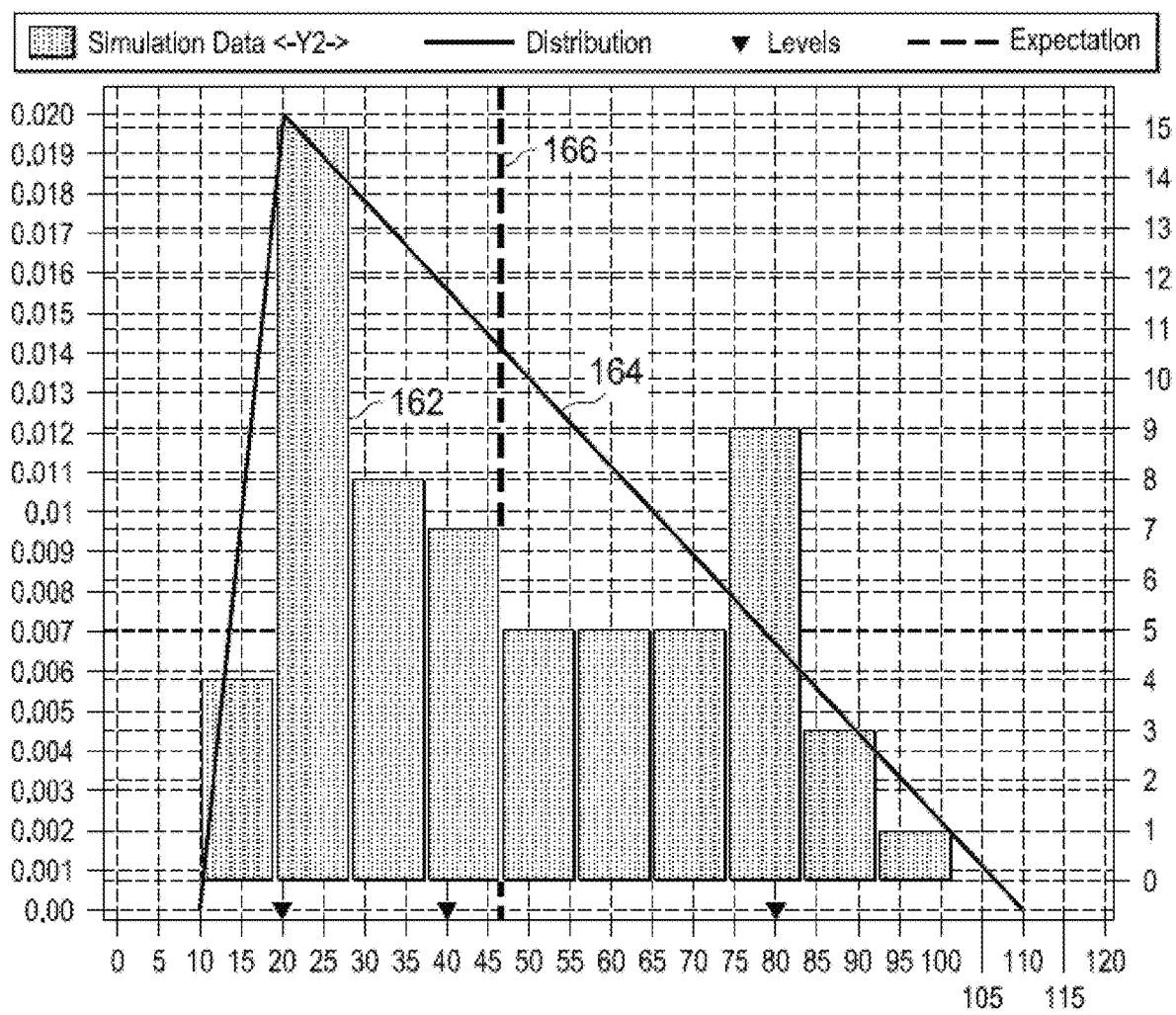

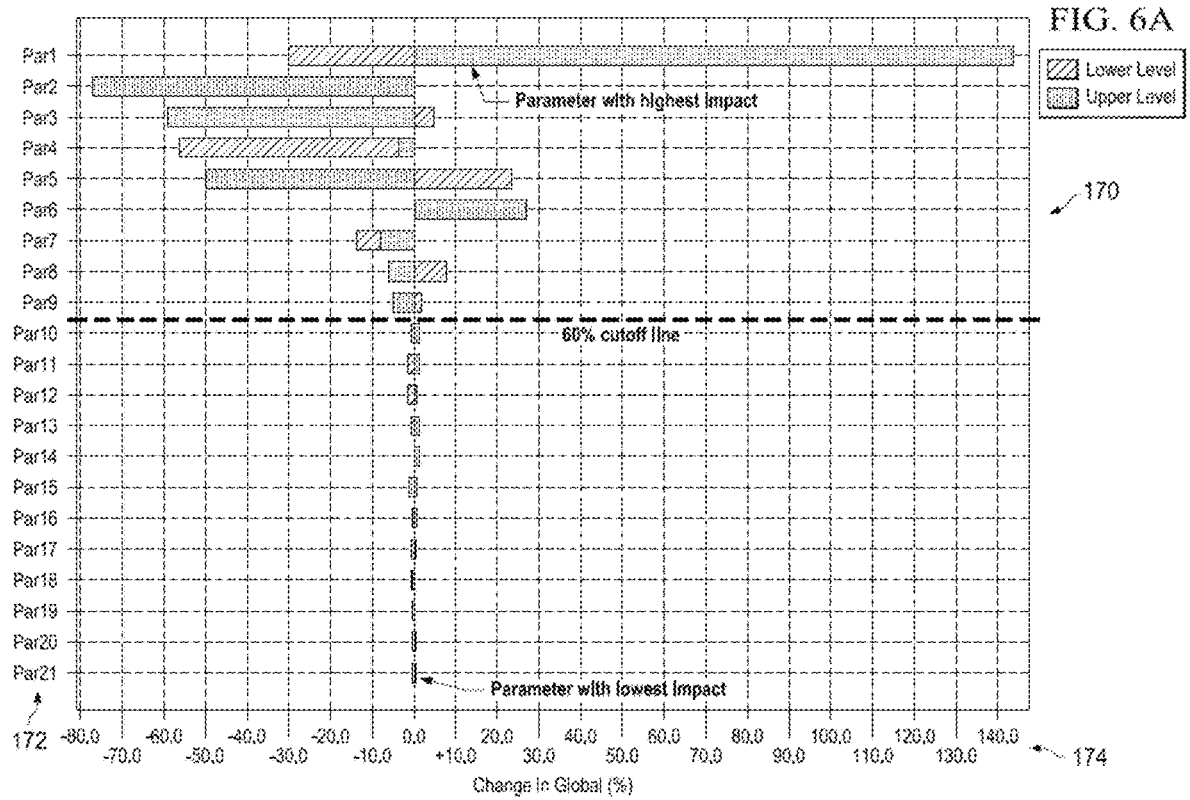

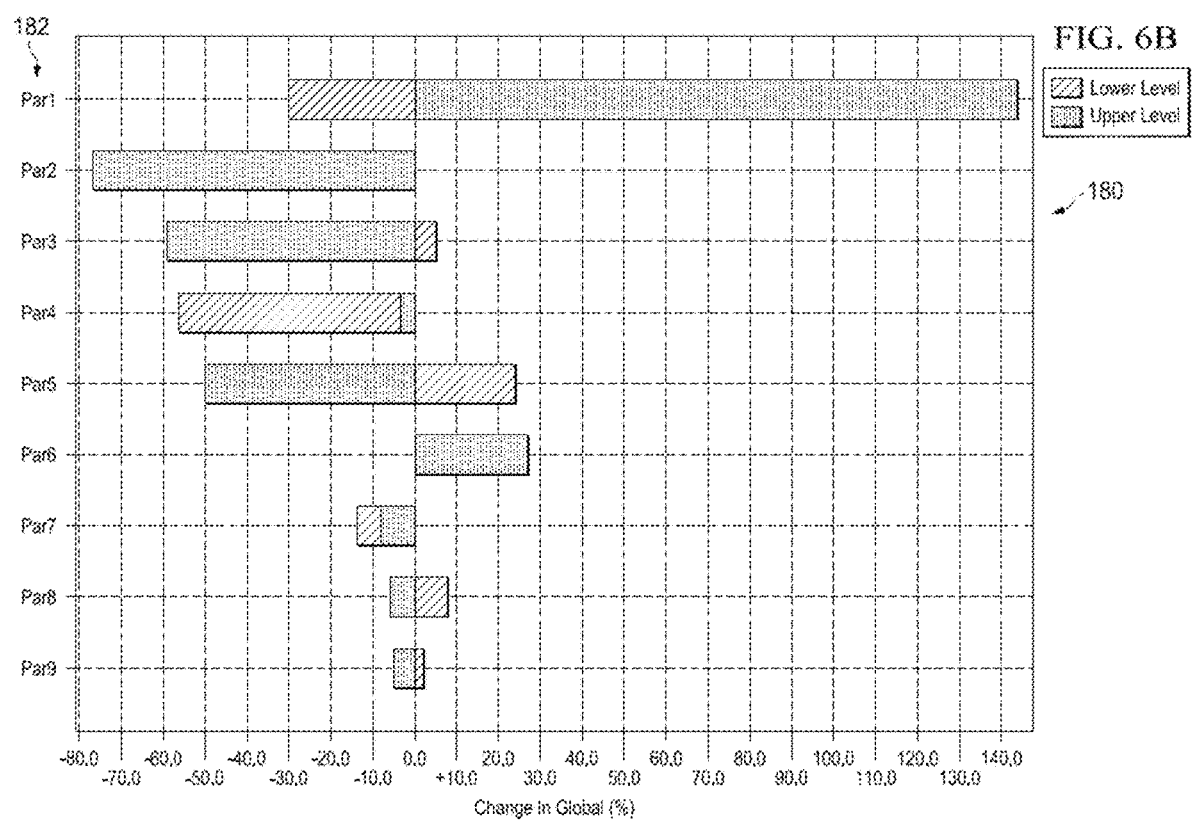

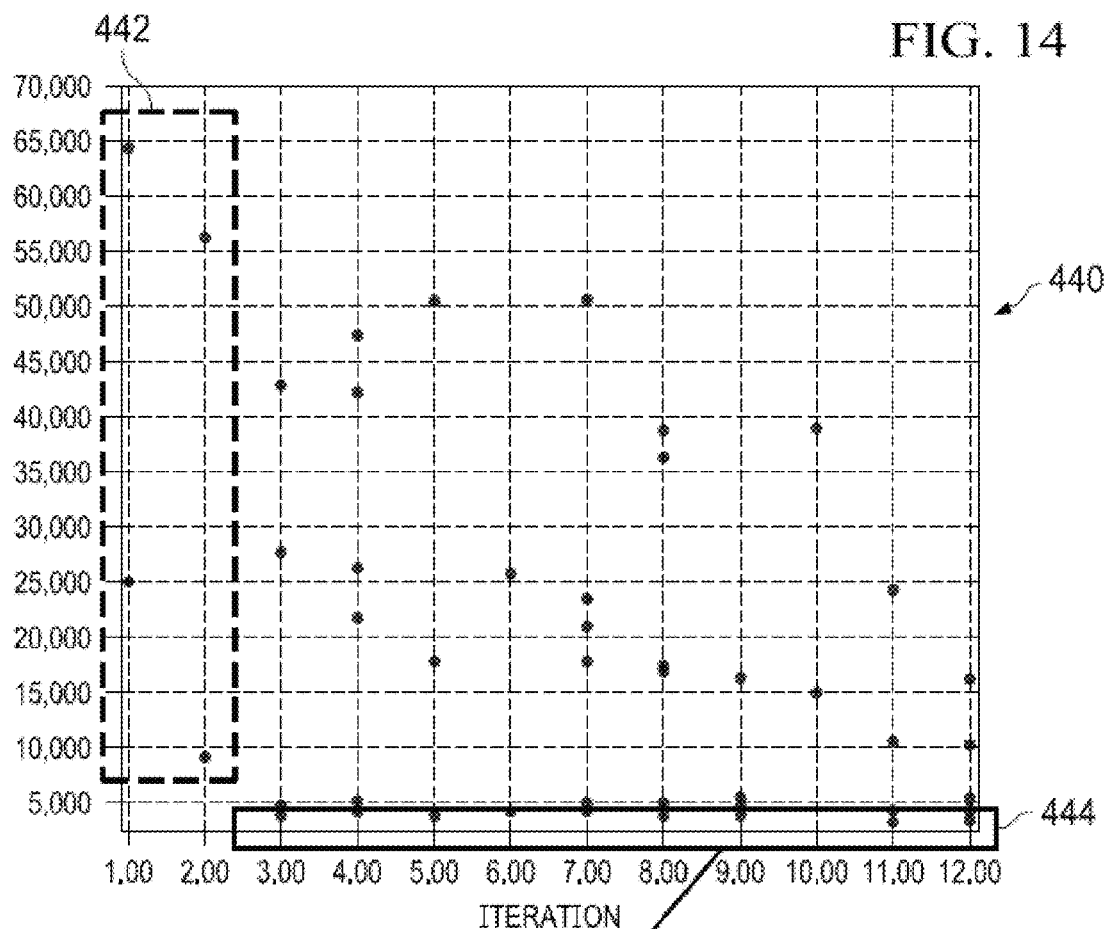
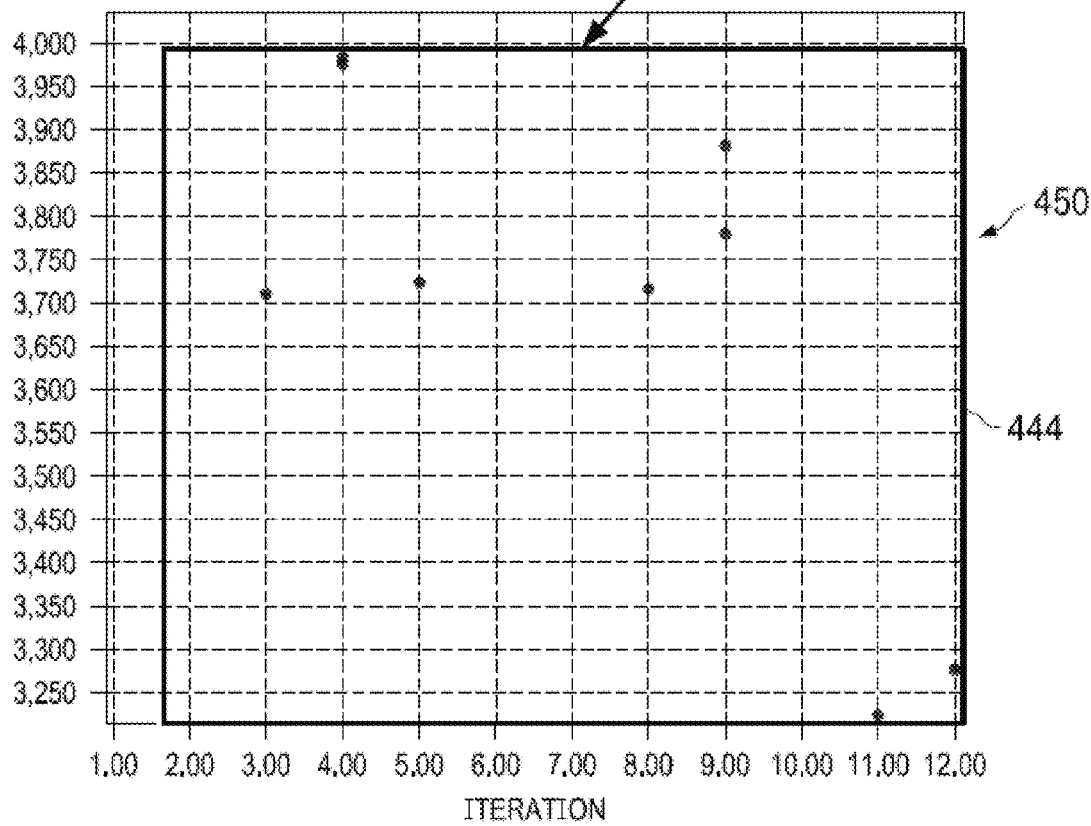
FIG. 14

METHOD FOR DYNAMIC CALIBRATION AND SIMULTANEOUS CLOSED-LOOP INVERSION OF SIMULATION MODELS OF FRACTURED RESERVOIRS

TECHNICAL FIELD

This disclosure relates to methods, systems, and apparatus for improving the exploration for hydrocarbons.

BACKGROUND

Hydrocarbons, such as oil and gas, occur in the Earth's subsurface at a depth ranging from a few hundred meters to several kilometers and are found in geological formations, which are layers of rock. As such, prospecting for hydrocarbons includes the difficult tasks of identification of where such geological formations exist and extraction of the hydrocarbons from these geological formations at such depths. Identifying the location of hydrocarbons may include the conducting of geological surveys collected through, for example, seismic prospecting. These geological surveys can be employed to construct geological maps representing the structure of areas of the outer crust of the Earth.

SUMMARY

Simulation models of fractured reservoirs are usually represented by dual porosity—dual permeability (DPDP) models. Traditionally, deterministic data processing processes are deployed to model prominent fracture corridors based on borehole image logs. Traditionally, the fracture model is defined implicitly in the reservoir simulation model by specifying a 3D distribution of fracture indicators that spatially represent the presence of the fracture in the grid. Such approach bears several approximations and limitations that diminish geological consistency of fracture model. For example, to reduce the spatial complexity, fractures usually are usually extended from top to bottom of the simulation grid. For example, fractures' thickness usually retain the dimension of one grid-cell. For example, fracture properties (porosity, permeability, block-length ($L_x$, $L_y$, $L_z$) are usually assigned simplistically and without representative spatial variations.

Such data processing processes usually render fracture model realizations with high, medium and low confidence, which are consecutively dynamically validated and calibrated in the process of reservoir simulation model history matching. Most frequently the deterministic approach to modeling of DPDP reservoirs comes with the ultimate deficiency: high/medium/low confidence realizations of fracture models do not comprehensively integrate a robust, a-priori understanding and quantification of uncertainty, inherent to complex, natural fracture reservoirs in terms of geometrical and petrophysical attributes of fractures. Consequently, when dynamically evaluated by the reservoir simulator, such fracture models render suboptimal performance and ultimately require a significant amount of manual modifications and alterations that are not geologically consistent (e.g. "box" multipliers). This proves to be extremely resource-intense and time-consuming and imposes significant restrictions on the efficiency of history matching process.

Implementations of this disclosure generally relate to a simultaneous Closed-Loop dynamic inversion of the Fracture Reservoir Model (FRM), which integrates the high-resolution Geological Model (GM), Discrete Fracture Network Model (DFNM) and reservoir Simulation Model (SM). The methods and systems described in this disclosure provide for the following advantages. The methods and systems described include a new joint definition of prior term of misfit objective function that combines uncertain parameters from both, the geological model and DFNM. Furthermore, the systems and methods described in this disclosure enable adaptive uncertainty quantification and adjustments of DFNM. Additionally, the systems and methods described in this disclosure allow multi-variate DFNM parameter control, which cannot be achieved by a deterministic/manual approach of fracture modeling. These systems and methods described enable robust and continuous updating of DFNM parameters, including both geometric and petrophysical parameters, and are integrated in robust, global optimization process for simultaneous updating of relevant FRM attributes that renders geologically consistent simulation model history match.

This process enables the generation of more geologically consistent simulation model updates of fractured (dual porosity, dual permeability or DPDP) reservoirs in the form of multiple realizations and scenarios. In some implementations, the processes of the modeling system provide a Closed-Loop inversion of DPDP simulation model inversion and dynamic calibration with pressure and production data through simultaneous model parameterization and data assimilation. In some implementations, this process provides a robust, multi-variate reservoir uncertainty quantification by simultaneous integration of uncertainty attributes of the geomodel and (discrete) fracture (network) model. In some implementations, the processes of the modeling system provide unique capability of the proposed process to integrate DFNM geomechanical properties (e.g. paleo-stress, pore-pressure) as attributes for predicting the fracture network density in the process of Closed-Loop inversion. In some implementations, the processes of the modeling system provide significant acceleration of DPDP model history matching process achieved through implementation of multi-objective global numerical optimization under uncertainty, minimization of the manual history match process and deployment of massively-parallel HPC frameworks. In some implementations, the processes of the modeling system provide generation of geologically consistent DPDP reservoir simulation models with better predictive value for production forecasting and field development planning. In some implementations, the processes of the modeling system provide development and deployment of method for simultaneous updating of DPDP models (matrix and fractures) in Closed-Loop optimization process under reservoir uncertainty.

In some aspects, computer-implemented methods for generating a fractured reservoir model executed by one or more processors includes: receiving a seismic dataset of a surveyed subsurface, the seismic dataset comprising a set of parameters representing physical features of the surveyed subsurface; identifying a dynamic response of each parameter of the set of parameters, wherein each parameter of the set is associated with a range of values; selecting a subset of parameters from the set of parameters based on the dynamic response of each parameter; sampling an outer boundary of a parameter uncertainty domain, the parameter uncertainty domain based on the range of values for each parameter of the subset of parameters; adjusting the range of values associated with each parameter of the subset based on the sampling; generating a geo-model based on the adjusted range of values associated with each parameter of the subset; generating a discrete fracture network model based on the geo-model; generating a scenario of a simulation model based on the discrete fracture network model and the geo-model; performing a forward simulation based on the scenario of the simulation model; determining that a misfit of the forward simulation is below a threshold by evaluating an objective function; and producing a 3D model based on the forward simulation.

In some aspects, a non-transitory, computer-readable medium stores one or more instructions executable by a computer system to perform operations includes: receiving a seismic dataset of a surveyed subsurface, the seismic dataset comprising a set of parameters representing physical features of the surveyed subsurface; identifying a dynamic response of each parameter of the set of parameters, wherein each parameter of the set is associated with a range of values; selecting a subset of parameters from the set of parameters based on the dynamic response of each parameter; sampling an outer boundary of a parameter uncertainty domain, the parameter uncertainty domain based on the range of values for each parameter of the subset of parameters; adjusting the range of values associated with each parameter of the subset based on the sampling; generating a geo-model based on the adjusted range of values associated with each parameter of the subset; generating a discrete fracture network model based on the geo-model; generating a scenario of a simulation model based on the discrete fracture network model and the geo-model; performing a forward simulation based on the scenario of the simulation model; determining that a misfit of the forward simulation is below a threshold by evaluating an objective function; and producing a 3D model based on the forward simulation.

In some aspects, computer-implemented systems include a computer memory; and a hardware processor interoperably coupled with the computer memory and configured to perform operations including: a computer-implemented method for generating a fractured reservoir model executed by one or more processors includes: receiving a seismic dataset of a surveyed subsurface, the seismic dataset comprising a set of parameters representing physical features of the surveyed subsurface; identifying a dynamic response of each parameter of the set of parameters, wherein each parameter of the set is associated with a range of values; selecting a subset of parameters from the set of parameters based on the dynamic response of each parameter; sampling an outer boundary of a parameter uncertainty domain, the parameter uncertainty domain based on the range of values for each parameter of the subset of parameters; adjusting the range of values associated with each parameter of the subset based on the sampling; generating a geo-model based on the adjusted range of values associated with each parameter of the subset; generating a discrete fracture network model based on the geo-model; generating a scenario of a simulation model based on the discrete fracture network model and the geo-model; performing a forward simulation based on the scenario of the simulation model; determining that a misfit of the forward simulation is below a threshold by evaluating an objective function; and producing a 3D model based on the forward simulation.

Embodiments of these methods and systems can include one or more of the following features.

In some embodiments, identifying a dynamic response of one or more parameters of the set of parameters comprises: assigning one or more of a tolerance value range and a probability sampling distribution to each parameter of the set of parameters based on the uncertainty domain associated with each parameter; determining a sensitivity metric for each of the parameters based on the one or more of the tolerance value range and the probability sampling distribution of each of the parameters; ranking the parameters of the set of parameters based on the sensitivity metric associated with each of the parameters; and selecting, from the set of the parameters, the subset of parameters including one or more higher ranked parameters, the one or more higher ranked parameters representing higher contribution to the dynamic response of the fractured reservoir model than one or more lower ranked parameters of the set of parameters. In some cases, assigning the one or more of the tolerance value range and the probability sampling distribution is based on selected types of basin geology and sedimentology associated with the seismic dataset.

In some embodiments, sampling the outer boundary of the parameter uncertainty domain comprises a two level design of experiments (DoE) process. In some cases, 5. Methods also include refining the sampling based on a three level design of experiments (DoE) process.

In some embodiments, the set of parameters is selected from a group consisting of permeability, porosity, fracture density, fracture intensity, fracture geometry, fracture aperture, fracture orientation, stress, pore pressure, fluid contacts, fault transmissibility, Kv/Kh ratio, fluid properties, and aquifer strength.

In some embodiments, generating the scenario of a simulation model based on the discrete fracture network model and the geo-model includes: defining uncertainty tolerance range of fluid contacts in the simulation model; defining uncertainty tolerance range of fault transmissibility in the simulation model; defining uncertainty tolerance range of Kv/Kh in the simulation model; defining uncertainty tolerance range of fluid properties (PVT) in the simulation model; defining uncertainty tolerance range of aquifer strength in the simulation model; and defining uncertainty tolerance range of external fluxes in the simulation model.

In some embodiments, methods and systems also include, in response to determining that the misfit of the forward simulation is not below the threshold: redefining the objective function by an assisted history matching process in which a new parameter uncertainty domain is sampled for each of the geo-model, the discrete fracture network model, and the scenario of a simulation model; and generating a history matched model based on the redefined objective function. In some cases, systems and methods also include generating a plurality of history matched models based on an iterative process of redefining the objective function; and ranking the plurality of history matched models based on misfits determined from the objective functions associated with each of the history matched models.

It is appreciated that methods in accordance with the present disclosure can include any combination of the aspects and features described in this disclosure. That is, methods in accordance with the present disclosure are not limited to the combinations of aspects and features specifically described in this disclosure, but also may include any combination of the aspects and features provided.

The details of one or more implementations of the present disclosure are set forth in the accompanying drawings and the description included in this disclosure. Other features and advantages of the present disclosure will be apparent from the description and drawings, and from the claims.

BRIEF DESCRIPTION OF DRAWINGS

The patent or application file contains at least one drawing executed in color. Copies of this patent or patent application publication with color drawing(s) will be provided by the Office upon request and payment of the necessary fee.

FIGS. 5A-5D show examples of sampling distributions assigned to uncertain parameters with associated tolerance bounds/intervals.

FIGS. 6A-6B include tornado charts as a result of sensitivity runs using one variable at the time (OVAT) with assigned sensitivity cutoffs to identify N-highest ranked parameters.

FIG. 14 shows a representation of behavior of a global objective function (OF) after completed history matching process and the selection and ranking of history matched models propagated into production forecasting (prediction).

DETAILED DESCRIPTION

Figure 1:
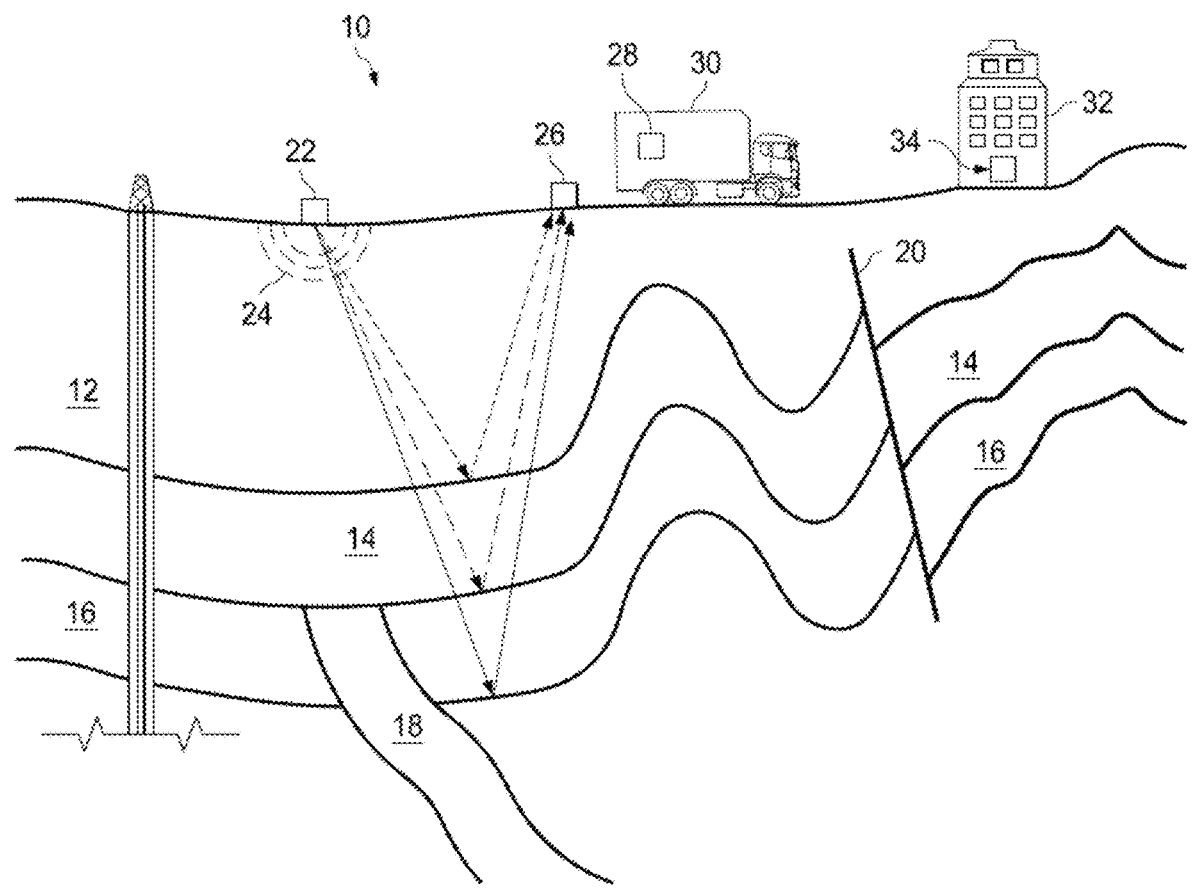
FIG. 1 is a schematic view of a seismic survey being performed to map subterranean features such as facies and faults.

This disclosure generally describes a system to generate geo-cellular models with improved predictability. The disclosure is presented to enable any person skilled in the art to make and use the disclosed subject matter in the context of one or more particular implementations. Various modifications to the disclosed implementations will be readily apparent to those skilled in the art, and the general principles defined in this application may be applied to other implementations and applications without departing from scope of the disclosure. Thus, the present disclosure is not intended to be limited to the described or illustrated implementations, but is to be accorded the widest scope consistent with the principles and features disclosed in this application.

To extract the contained hydrocarbons, a respective geological formation has to have sufficient porosity and permeability to be productive. Porosity includes the fraction of the bulk volume of rock that is not rock (for example, the spaces in between grains). Porosity may range from a few percent to more than 30 percent. Hydrocarbon formations may also contain water in the pore spaces, which may or may not flow along with the hydrocarbon. Permeability includes a measure of how easily fluids flow through a porous rock, which may vary dramatically by layer. Geological models, for example, can be employed to capture the spatial variability in porosity, permeability, and water and hydrocarbon saturations.

Moreover, geological layers and formations may exhibit even more complexity in the subsurface than they do at the surface. These formation may include, for example, meandering river channels and streams, carbonate reefs, beaches, dunes and the jumbled mix of sands and shales that characterize turbidities. Additionally, complex faults, salt domes and other features further complicate the subterranean environment.

Seismic surveys, well logs, cores, and so forth may be employed to generate 3D models that map subsurface formations. For example, a geo-cellular model may use grids to construct a static model of a reservoir. These grids may include information regarding the petrophysical, geological, geophysical, fluid, and rock depicted as spatially distributed throughout the respective reservoir. For example, a geo-cellular model may include a vertical cell size of one to two feet. Such a model can be constructed by kriging the well logs into the space using a deterministic or a stochastic approach. Kriging comprises a method of interpolation for which the interpolated values are modeled by a Gaussian process governed by prior covariances, as opposed to a piecewise-polynomial spline chosen to optimize smoothness of the fitted values. In some implementations, a seismic driven rock property (for example, porosity) can be integrated into a geo-cellular model as seismic driven rock properties have more spatial coverage as compared to wells. A correlation can be made between the integrated seismic property and a log property. Such log properties may be obtained via well logging, also known as wireline logging. Well logging includes the collection of data (log properties) in the borehole environment. The collected log properties may enable, for example, the determination of subsurface physical properties and reservoir parameters. In general, well logs respond to variations in rock matrix and pore fluid composition. An example correlation made between the integrated seismic property and a log property, may include determining a correlation value to weight the seismic property as a soft constraint in the geo-cellular model. In some implementations, such a model may include large imperfections (for example, a positive correlation where, in some layers, the properties correlate negatively) as the resolutions of seismic properties and well log are not the same. Thus comparing these data points directly can results in poor correlation.

Geo-cellular models may be input to a dynamic model, which can be employed for reservoir simulations. For example, in a reservoir simulator, fluid flow and material balance equations may be solved for each of the grids within the geo-cellular model to predict reservoir behavior under various alternatives.

Seismic data integration into a geologic model is fraught with lacunae due to large dissimilarity in log and seismic scales. Seismic property does not have the vertical resolution of a geological model and a geological model does not have the seismic heterogeneity. This data processing process brings in a concept where seismic property can be integrated with a 3D weight which is varying both spatially and temporally.

In view of the forgoing, the described system includes a methodology to improve reliability in generated geo-cellular models. In some implementations, the described modeling system improves geo-cellular models by an integrated process of simultaneous fractured reservoir model (FRM) inversion. This process enables the generation of more geologically consistent simulation model updates of fractured (dual porosity, dual permeability or DPDP) reservoirs in the form of multiple realizations and scenarios.

In some implementations, the processes of the modeling system provide a Closed-Loop inversion of DPDP simulation model inversion and dynamic calibration with pressure and production data through simultaneous model parameterization and data assimilation.

In some implementations, this process provides a robust, multi-variate reservoir uncertainty quantification by simultaneous integration of uncertainty attributes of the geomodel and (discrete) fracture (network) model.

In some implementations, the processes of the modeling system provide unique capability of the proposed process to integrate DFNM geomechanical properties (e.g. paleo-stress, pore-pressure) as attributes for predicting the fracture network density in the process of Closed-Loop inversion.

In some implementations, the processes of the modeling system provide significant acceleration of DPDP model history matching process achieved through implementation of multi-objective global numerical optimization under uncertainty, minimization of the manual history match process and deployment of massively-parallel HPC frameworks.

In some implementations, the processes of the modeling system provide generation of geologically consistent DPDP reservoir simulation models with better predictive value for production forecasting and field development planning.

In some implementations, the processes of the modeling system provide development and deployment of method for simultaneous updating of DPDP models (matrix and fractures) in Closed-Loop optimization process under reservoir uncertainty.

For simplicity, Table 1 is provided to show example terms to be associated with abbreviations in this document.

TABLE 1

Term abbreviations.

| Term | Abbreviation |
|---|---|
| Fractured Reservoir Model | FRM |
| One Variable at the Time | OVAT |
| Design of Experiments | DoE |
| Plackett-Burman DoE | P-B |
| Latin Hypercube DoE | LHC |
| Geological model | GM |
| Discrete Fracture Network model | DFNM |
| Simulation model | SM |
| Objective function | OF |
| Petrophysical Rock Type | PRT |
| Pressure Transient Analysis | PTA |
| Flow capacity (permeability * reservoir interval thickness) | KH |
| Repeat Formation Tester | RFT |
| Modular Formation Dynamics Tester | MDT |

FIG. 1 is a schematic view of a seismic survey being performed to map subterranean features such as facies and faults in a subterranean formation 10. The integrated process of simultaneous fractured reservoir model (FRM) inversion can be used to better perform seismic surveys by providing more geologically consistent models of a reservoir given the data received. The subterranean formation 10 includes a layer of impermeable cap rocks 12 at the surface. Facies underlying the impermeable cap rocks 12 include a sandstone layer 14, a limestone layer 16, and a sand layer 18. A fault line 20 extends across the sandstone layer 14 and the limestone layer 16.

A seismic source 22 (for example, a seismic vibrator or an explosion) generates seismic waves 24 that propagate in the earth. The velocity of these seismic waves depends properties such as, for example, density, porosity, and fluid content of the medium through which the seismic waves are traveling. Different geologic bodies or layers in the earth are distinguishable because the layers have different properties and, thus, different characteristic seismic velocities. For example, in the subterranean formation 10, the velocity of seismic waves traveling through the subterranean formation 10 will be different in the sandstone layer 14, the limestone layer 16, and the sand layer 18. As the seismic waves 24 contact interfaces between geologic bodies or layers that have different velocities, the interface reflects some of the energy of the seismic wave and refracts part of the energy of the seismic wave. Such interfaces are sometimes referred to as horizons.

The seismic waves 24 are received by a sensor or sensors 26. Although illustrated as a single component in FIG. 1, the sensor or sensors 26 are typically a line or an array of sensors 26 that generate an output signal in response to received seismic waves including waves reflected by the horizons in the subterranean formation 10. The sensors 26 can be geophone-receivers that produce electrical output signals transmitted as input data, for example, to a computer 28 on a seismic control truck 30. Based on the input data, the computer 28 may generate a seismic data output such as, for example, a seismic two-way response time plot.

A control center 32 can be operatively coupled to the seismic control truck 30 and other data acquisition and wellsite systems. The control center 32 may have computer facilities for receiving, storing, processing, and/or analyzing data from the seismic control truck 30 and other data acquisition and wellsite systems. For example, computer systems 34 in the control center 32 can be configured to analyze, model, control, optimize, or perform management tasks of field operations associated with development and production of resources such as oil and gas from the subterranean formation 10. Alternatively, the computer systems 34 can be located in a different location than the control center 32. Some computer systems are provided with functionality for manipulating and analyzing the data, such as performing seismic interpretation or borehole resistivity image log interpretation to identify geological surfaces in the subterranean formation or performing simulation, planning, and optimization of production operations of the wellsite systems. For example, computer systems 34 located at a different location than the remote control center can be used to implement a modeling system 35 as described with reference to FIG. 4 that includes an integrated process of simultaneous fractured reservoir model (FRM).

In some embodiments, results generated by the computer system 34 may be displayed for user viewing using local or remote monitors or other display units. One approach to analyzing seismic data is to associate the data with portions of a seismic cube representing represent the subterranean formation 10. The seismic cube can also be display results of the analysis of the seismic data associated with the seismic survey.

Figure 2:
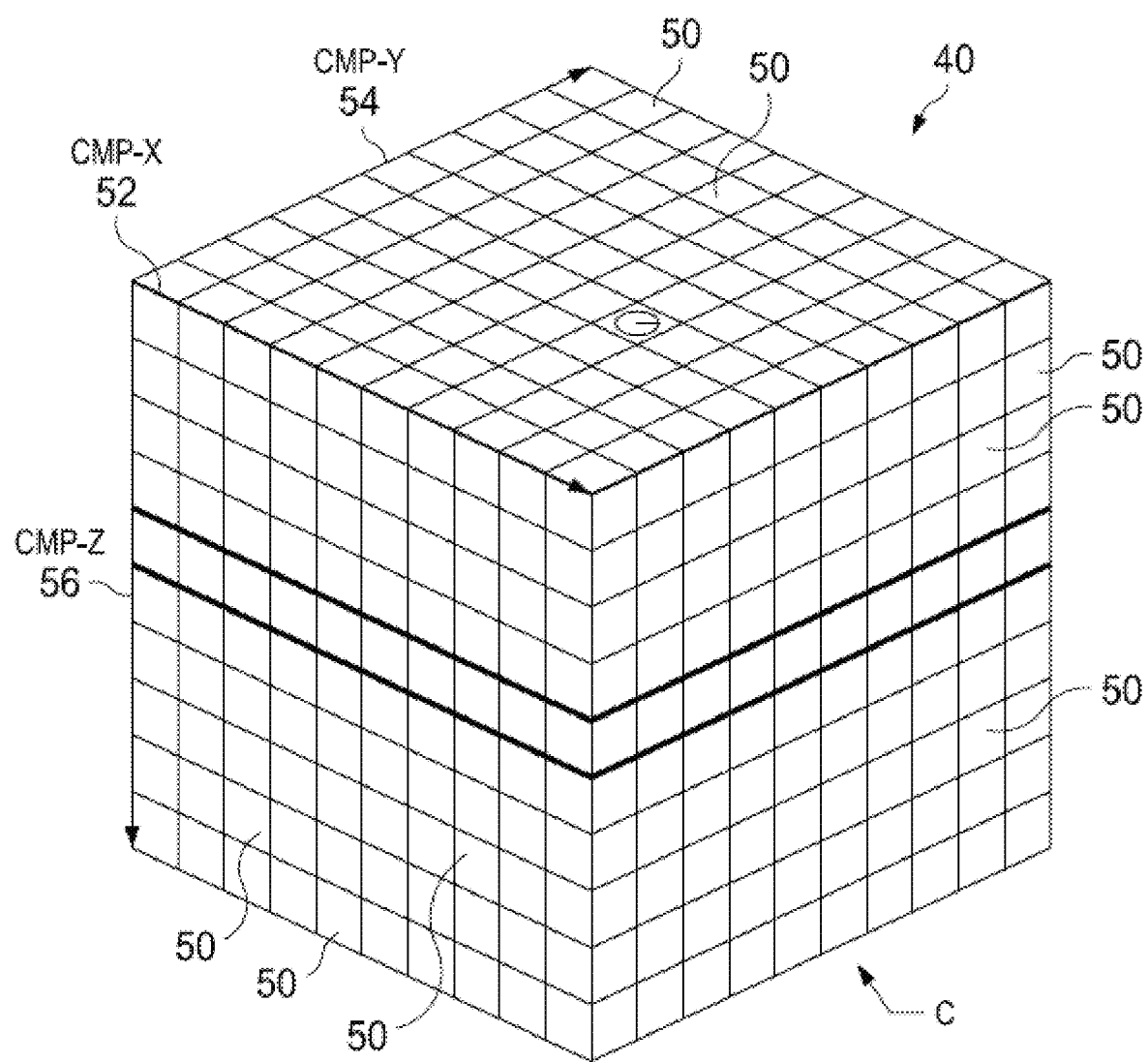
FIG. 2 illustrates a three-dimensional space for modeling subterranean features.

FIG. 2 illustrates a seismic cube 40 representing at least a portion of the subterranean formation 10. The seismic cube 40 is composed of a number of voxels 50. A voxel is a volume element and each voxel corresponds, for example, with a seismic sample along a seismic trace. The cubic volume C is composed along intersection axes of offset spacing times based on a Delta-X spacing 52, a Delta-Y offset spacing 54, and a Delta-Offset offset spacing 56. Within each voxel 50, statistical analysis can be performed on data assigned to that voxel to determine, for example, multimodal distributions of travel times and derive robust travel time estimates (according to mean, median, mode, standard deviation, kurtosis, and other suitable statistical accuracy analytical measures) related to azimuthal sectors allocated to the voxel 50.

Figure 3:
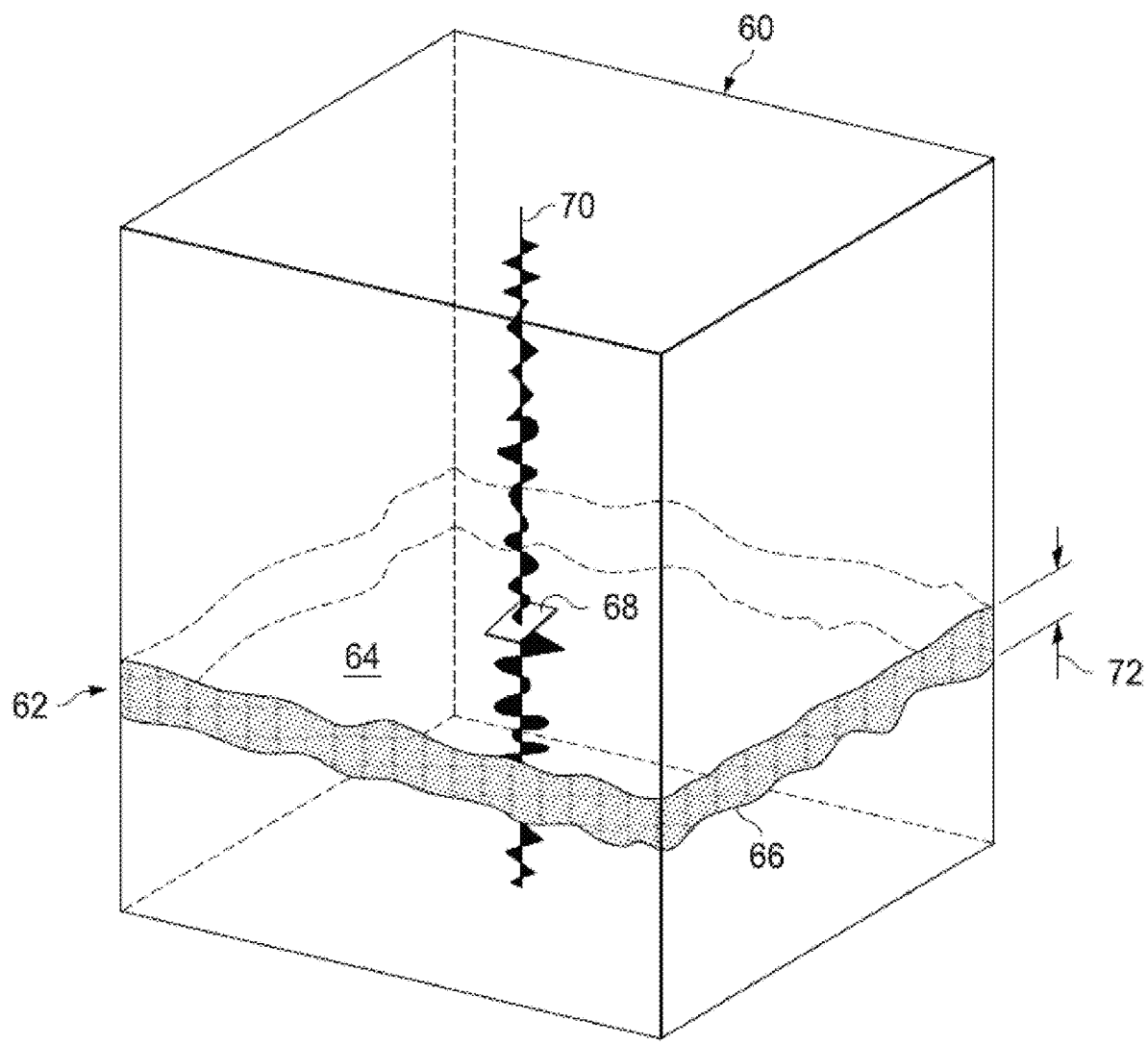
FIG. 3 illustrates a stratigraphic trace within a formation.

FIG. 3 illustrates a seismic cube 60 representing a formation. The seismic cube has a stratum 62 based on a surface (for example, amplitude surface 64) and a stratigraphic horizon 66. The amplitude surface 64 and the stratigraphic horizon 66 are grids that include many cells such as exemplary cell 68. Each cell is a seismic trace representing an acoustic wave. Each seismic trace has an x-coordinate and a y-coordinate and each data point of the trace corresponds to a certain seismic travel time or depth (t or z). For the stratigraphic horizon 66, a time value is determined and then assigned to the cells from the stratum 62. For the amplitude surface 64, the amplitude value of the seismic trace at the time of the corresponding horizon is assigned to the cell. This assignment process is repeated for all of the cells on this horizon to generate the amplitude surface 64 for the stratum 62. In some instances, the amplitude values of the seismic trace 70 within window 72 by horizon 66 are combined to generate a compound amplitude value for stratum 62. In these instances, the compound amplitude value can be the arithmetic mean of the positive amplitudes within the duration of the window, multiplied by the number of seismic samples in the window.

Figure 4A:
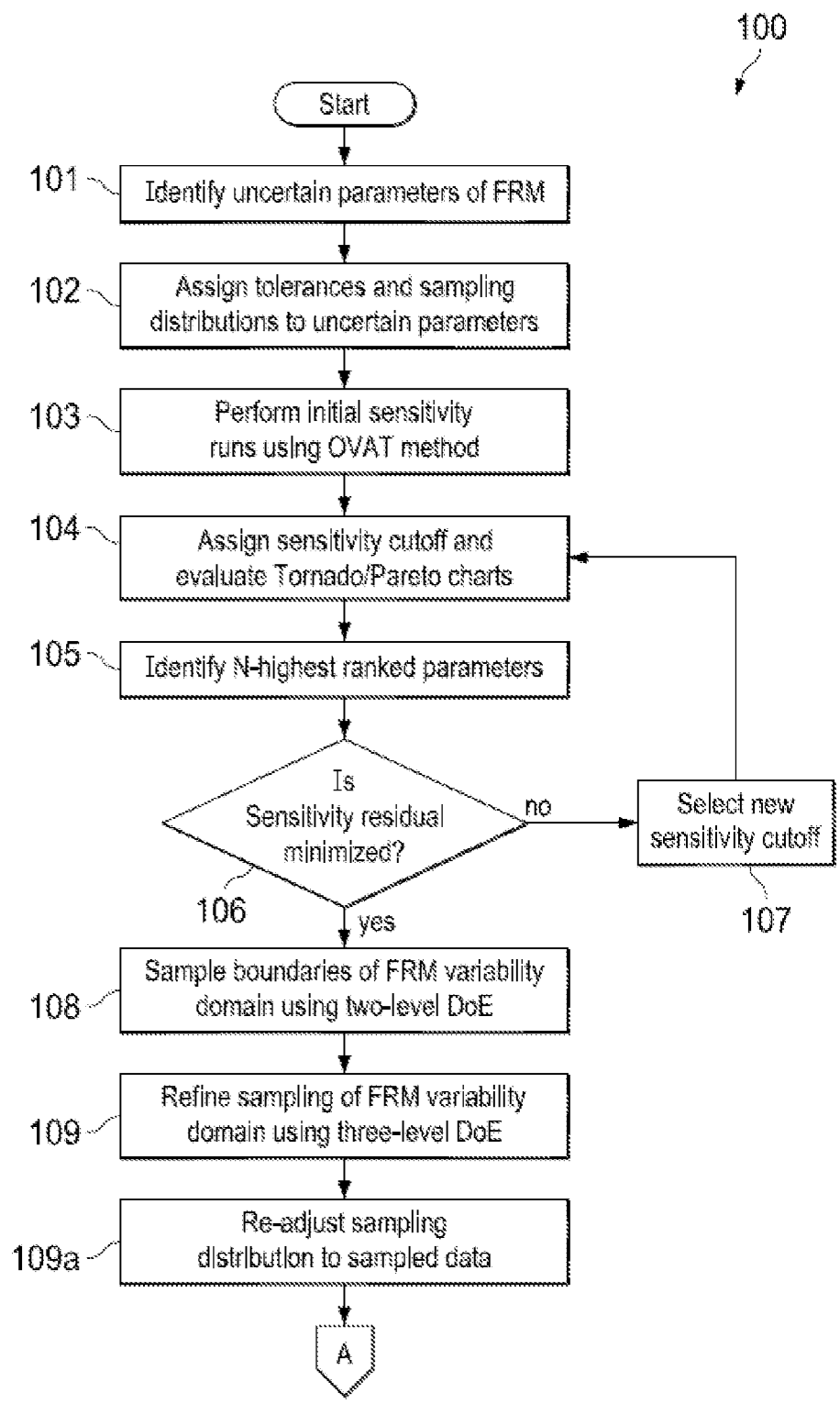
FIGS. 4A-4B show flowcharts including an example of an integrated process of simultaneous fractured reservoir model (FRM) inversion.
Figure 4B:
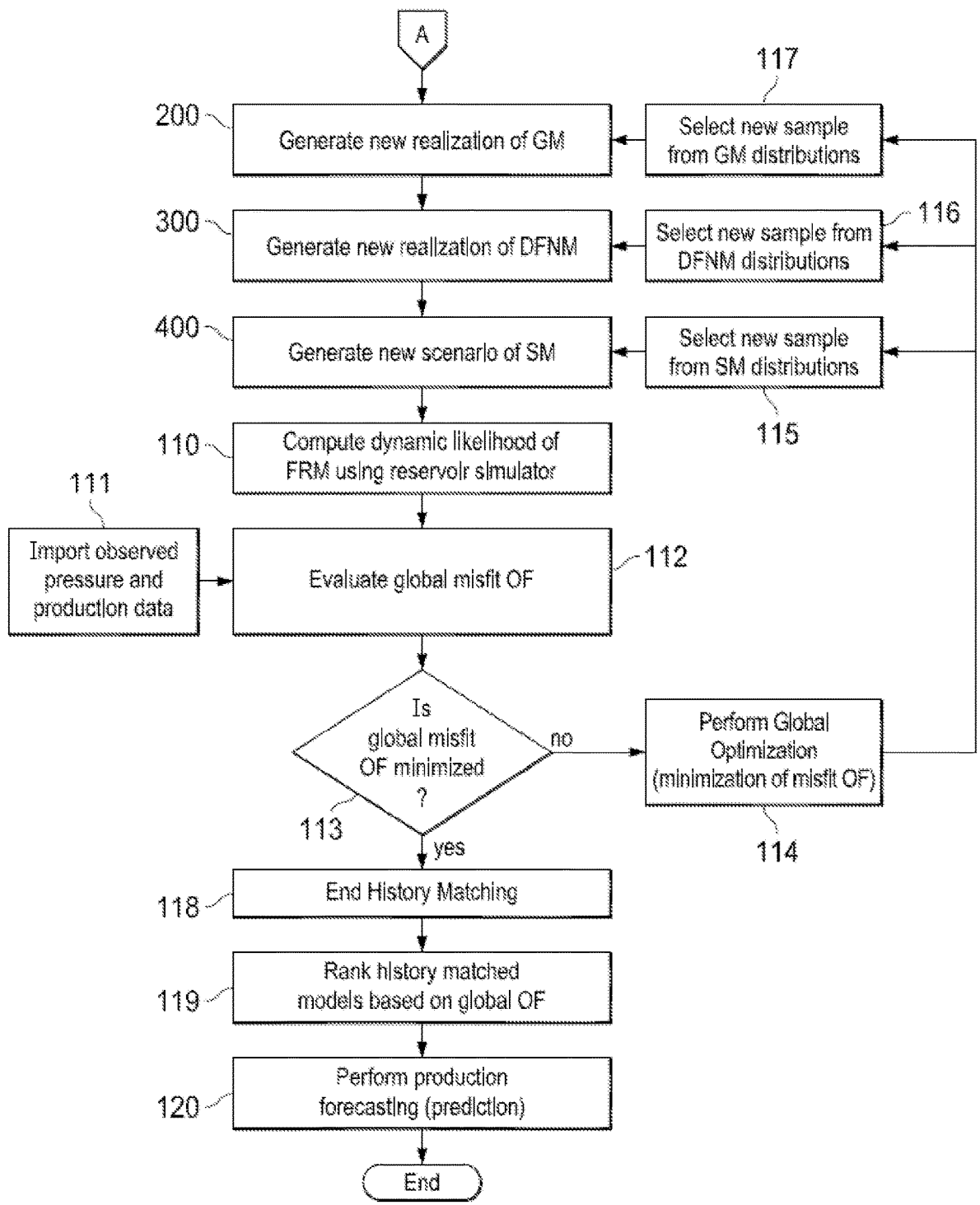

Turning to FIGS. 4A-4B, a process 100 including an integrated process of simultaneous fractured reservoir model (FRM) inversion is shown to model a reservoir based on the seismic data received as described in relation to FIGS. 1-3 as well as other subsurface and production data sources. In some implementations, the actions of the process 100 are performed on the modeling system 35, such as the computing system 500 described in FIG. 15. The modeling system 35 is configured to identify (101) comprehensive sets of FRM parameters, corresponding to particular component of FRM, In some implementations, the sets of FRM parameters are identified using prior engineering and data analysis and techniques well known in art. In relation to uncertainty quantification, the FRM represents an approximate union of the geological model, DFNM and simulation model: M≅GM∪DFNM∪SM. Tables 2a-2c list most prevalent FRM attributes considered in Closed-Loop model inversion. However, this does not necessarily represent a comprehensive selection of parameters, which is typically case-dependent.

TABLE 2a

Prevalent FRM attributes considered in Closed-Loop model inversion for a geological model. The table does not necessarily represent a comprehensive set of parameters.

| | Geological Model (GM) Input | Output (arrays) |
|---|---|---|
| Matrix Porosity | Drivers: AT, sesmic facies, seismic porosity Variogram (major/minor, vertical, azimuth) | Matrix Porosity Matrix Permeability (KX) Matrix permeability |

TABLE 2a-continued

Prevalent FRM attributes considered in Closed-Loop model inversion for a geological model. The table does not necessarily represent a comprehensive set of parameters.

| Matrix Permeability (Φ to k) | Regression Cloud Transform Correlation with permeability logs Dynamic calibration of permeability logs (PTA/KH) | (KZ) Water Saturation |
|---|---|---|
| SW variability | Permeability Porosity HAFWL RT | |

TABLE 2b

Prevalent FRM attributes considered in Closed-Loop model inversion for DFNM. The table does not necessarily represent a comprehensive set of parameters.
Discrete Fracture Network Model (DFNM)

| INPUT | OUTPUT (Arrays) |
|---|---|
| Fracture density/intensity | Fracture porosity |
| Fracture geometry (length, height) | Fracture permeability |
| Fracture aperture | Fracture Lx, Ly, Lz |
| Fracture orientation (azimuth) | Fracture shape factor (σ) |
| Stress (minimum, maximum, vertical) | |
| Pore Pressure | |

TABLE 2c

Prevalent FRM attributes considered in Closed-Loop model inversion for a simulation model. The table does not necessarily represent a comprehensive set of parameters.
Simulation Model (SM)

| INPUT | OUTPUT (Response) |
|---|---|
| Fluid contacts | Variability in volumes |
| Fault transmissibility | Variability in pressure |
| Kv/Kh | Variability in rates |
| PVT | Variability in fluid dynamics |
| SCAL | |
| Aquifer Strength | |

The modeling system 35 is configured to assign (102) tolerances and probability sampling distributions to uncertain parameters. In some implementations, prior engineering and data analysis and techniques well known in art can be used. For example, the modeling system 35 can assign the tolerances to the parameters of Tables 2a-2c. In some implementations, the data analysis techniques can include goodness of fit testing (Poison Chi-Square, Student t-test, Kolmogorov-Smirnov), EDA, Bayesian inference, and so forth. These techniques are not site or field specific. Rather the distributions of characteristic values are more associated with the types of basin geology and sedimentology (for example, carbonates, sandstones, shale, etc.).

To illustrate these assignments, FIGS. 5A-5D show a selection of uncertain parameters with assigned probability density functions (PDFs) and associated uncertainty intervals (tolerances). In each of FIGS. 5A-5D, a sampling efficiency obtained with multi-level DoE methods is depicted as well with bounded histograms, represented by bars.

Figure 5A:
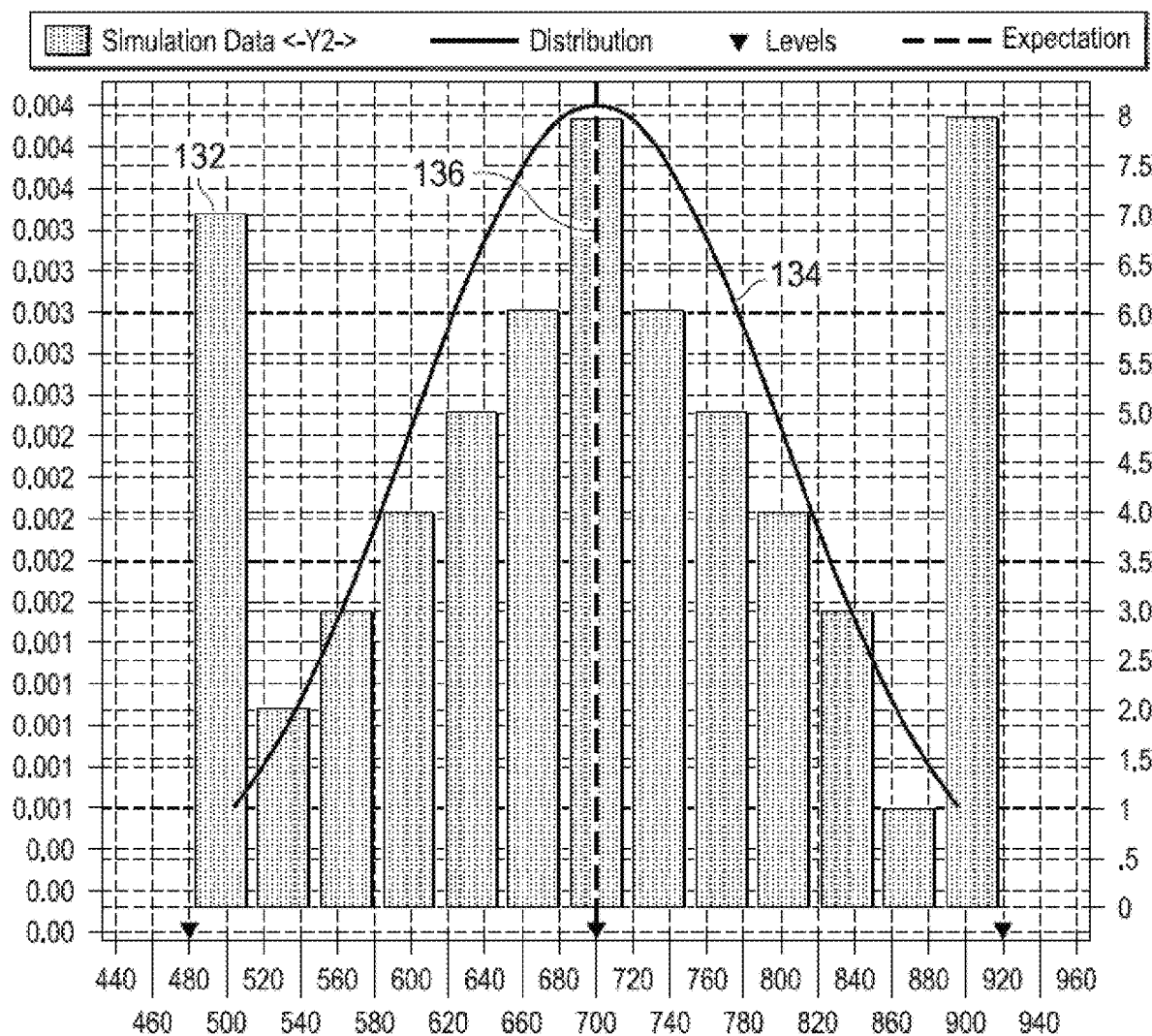

Turning to FIG. 5A, graph 130 shows simulated data 132 overlaid with a normal distribution line 134. In this example, the simulation data represents a fracture length parameter.

An expected value 136 is represented by a center line. Turning to FIG. 5B, graph 140 shows simulated data 142 overlaid with a uniform distribution line 144. In this example, the simulation data represents a maximum stress parameter. An expected value 146 is represented by a center line. Turning to FIG. 5C, graph 150 shows simulated data 152 overlaid with a log-normal distribution line 154. In this example, the simulation data represents a permeability multiplier parameter. An expected value 156 is represented by a center line. Turning to FIG. 5D, graph 160 shows simulated data 162 overlaid with a skewed triangular distribution line 164. In this example, the simulation data represents a variogram azimuth parameter. An expected value 166 is represented by a center line.

Returning to FIGS. 4A-4B, the modeling system 35 is configured to perform (103) one or more initial sensitivity runs to evaluate the sensitivity of uncertain FRM parameters on the dynamic response of FRM. In some implementations, the modeling system 35 is configured for a forward simulation with a reservoir simulator (for example, finite-difference or streamline) and the DoE technique one-variable-at-the-time (OVAT). In this method, FRM simulations begin with starting point, or baseline set of levels, and then each parameter is successively varied over its uncertainty/tolerance range with the other parameters held constant, without considering possible interactions between the variables. By performing an OVAT step, the modeling system 35 is configured to generate quantitative graphical representation of variable's importance on the dynamic FRM response in the form of tornado/pareto chart. In OVAT design of N factors with K levels (e.g. K=3 for min/mid/max), the number of realizations is K+2*(N-1). The modeling system 35 is then configured to assign (104) cutoff values for the sensitivities of each parameter and evaluate the variables according to tornado charges or pareto charts that are generated.

Turning to FIGS. 6A-6B, examples of the outputs of sensitivity runs of steps 103-105 are shown. In FIG. 6A, an example of tornado chart 170 is shown. Chart 170 shows results of sensitivity runs using OVAT on 21 FRM uncertain parameters 172. The change in global percentage 174 is shown. In FIG. 6B a tornado chart 180 is shown with assigned sensitivity cutoffs from step 104 of 60%. The modeling system 35 is configured to identify (105) the highest ranked parameters 182 that contribute upper 40% to the dynamic response of FRM. In this example, nine parameters 182 represent the 40% highest ranked parameters. In this example, the cutoff of 60% was selected based on engineering data analysis related to a response of a specific FRM and does not represent a unique identifier.

Returning to FIGS. 4A-4B, the modeling system 35 is configured to determine (106) whether the sensitivity residual is minimized (for example, less than a threshold value). If not, the modeling system 35 is configured to select (107) a different sensitivity cutoff. Process steps 106 and 107 can be iteratively repeated until the engineering data analysis confirms minimized residual in the variation of the dynamic response related to a specific FRM. In some implementations, the sensitivity residual is derived from the representation of response vector Y with, for example, linear function of parameters X. In some implementations, as an alternative, the response vector can also be approximated by second-order response surface:

$$Y = a_0 + a_1 X_1 + a_2 X_2 + \ldots + a_n X_n \quad (1)$$

where Y corresponds to simulated dynamic response vector (e.g. fluid rates, pressure) and X represents the vector of uncertain parameters. For example, in FIGS. 5A-5D, $X = X_1^n$; n=21.

Coefficients in Equation 1 can be for example, determined by the least-squares regression model, where the total sum of squares (SSY) for response variable Y can be partitioned as per Equation 2:

$$SS_Y = SS_{reg} + SS_{res\_err} \quad (2)$$

where $SS_{reg}$ represents the sum of squares due to regression and $SS_{res\_err}$ represents a sum of squares corresponding to residual error, defined as $SS_{res\_err} = \Sigma(Y-Y')^2$, where Y' corresponds to prediction of simulated response Y, in other words, approximated by linear or higher-order function.

The modeling system 35 verifies (106) whether calculated sensitivity residual is less than threshold value, obtained by the initially assigned sensitivity cutoff. For example, the modeling system 35 can assign the sensitivity cutoff based on visual inspection of calculated tornado charts. The modeling system 35 can define the threshold as a function of the change in global response function Y: the modeling system 35 sets the threshold at the parameter $X_n$ (ranked from most to least influential in the tornado chart), when the change in global response function Y falls below 5%. For example, the threshold was assigned as 60% for response vector presented in FIGS. 6A-6B, with Parameter 10, that has demonstrated the impact of <5%.

Continuing in the process 400 of FIGS. 4A-4B, the modeling system 35 is configured to quantitatively validate the domain of the uncertain parameters of FRM, received as the output of operation 106 (the parameters ranked above the cutoff threshold). The modeling system 35 is configured to sample (108) the outer boundaries of the parameter uncertainty domain, such as by using the two-level DoE. In some implementations, the modeling system 35 utilizes a Plackett-Burman DoE, which is a conventional screening design that can be used for studying up to k=(N-1)/(L-1) variables, where L represents the number of levels (for example, L=2) and N represents the number of simulation runs performed to evaluate the design. Generally, for Plackett-Burman design the importance of all main variables are of the same precision. Table 4 includes an example of a Plackett-Burman (P-B) design, as used to screen the uncertainty domain of five parameters of FRM inversion process, captured in Table 3, using 12 simulation runs. As indicated with the entries in parentheses in Table 4, the sampled values of uncertainty intervals will only contain the boundary values (for example, [min, max]), since the P-B DoE is a two-level design.

Table 3 includes a list of five selected parameters from the FRM inversion process 400 with associated uncertainty bounds and tolerance intervals. For convenience of DoE representation, the tolerance ranges of variables are converted to [-1,1] interval.

TABLE 3

List of Five Selected Parameters for FRM Inversion

| Model | Variable | Minimum value | Mean value | Maximum value |
|---|---|---|---|---|
| GM | Variogram_minor | 1500 (-1)* | 3500 (0) | 5500 (+1) |
| | Variogram_major | 3000 (-1) | 6500 (0) | 10000 (+1) |
| DFNM | Fracture_length | 480 (-1) | 500 (0) | 920 (+1) |
| | Maximum_stress | 80 (-1) | 85 (0) | 90 (+1) |
| | Friction_factor | 20 (-1) | 22.5 (0) | 25 (+1) |

Table 4 includes an example of two-level Design of Experiments (DoE), e.g. Plackett-Burman (P-B) design, as used to screen the uncertainty domain of five parameters of FRM inversion process. For convenience of DoE representation, the tolerance ranges of variables are converted to boundaries of [-1,1] interval.

TABLE 4

| | DoE example including Plackett Burman Design | | | | |
|---|---|---|---|---|---|
| Design | Fracture_length | Variogram_major | Variogram_minor | Maximum_stress | Friction_factor |
| 1 | 480 (−1)* | 3000 (−1) | 1500 (−1) | 80 (−1) | 20 (−1) |
| 2 | 920 (+1) | 3000 (−1) | 1500 (−1) | 90 (+1) | 25 (+1) |
| 3 | 480 (−1) | 10000 (+1) | 1500 (−1) | 80 (−1) | 20 (−1) |
| 4 | 920 (+1) | 3000 (−1) | 5500 (+1) | 80 (−1) | 25 (+1) |
| 5 | 920 (+1) | 10000 (+1) | 1500 (−1) | 80 (−1) | 25 (+1) |
| 6 | 480 (−1) | 10000 (+1) | 5500 (+1) | 90 (+1) | 25 (+1) |
| 7 | 920 (+1) | 3000 (−1) | 5500 (+1) | 80 (−1) | 20 (−1) |
| 8 | 920 (+1) | 10000 (+1) | 1500 (−1) | 90 (+1) | 20 (−1) |
| 9 | 920 (+1) | 10000 (+1) | 5500 (+1) | 90 (+1) | 20 (−1) |
| 10 | 480 (−1) | 10000 (+1) | 5500 (+1) | 80 (−1) | 25 (+1) |
| 11 | 480 (−1) | 3000 (−1) | 5500 (+1) | 90 (+1) | 20 (−1) |
| 12 | 480 (−1) | 3000 (−1) | 1500 (−1) | 90 (+1) | 25 (+1) |

The modeling system 35 is configured to refine (109) the sampling of the uncertain parameter variability domain, such as by using the three-level DoE. In some implementations, a Latin Hypercube (LHC) DoE can be used for this purpose, which is a conventional screening design. A LHC of n simulation runs and m parameters is a n×m matrix, where each column consists of n equally spaced intervals. Each array of LHC design, $d_{ij}$, in the design domain [0, 1] can be generated using Equation 3:

$$d_{ij} = \frac{l_{ij} + 0.5(n-1) + u_{ij}}{n}; i = 1, 2 \ldots, n; j = 1, 2, \ldots, m \quad (3)$$

where $u_{ij}$ is a random number sampled from [0, 1] and $l_{ij}$ represents an array of LH design (matrix). In Table 5 an example of the LHC design of five parameters of FRM inversion process is shown, captured in Table 3, using 16 designs (in addition to one base value design).

Table 5 shows an example of three-level Design of Experiments (DoE), e.g. Latin Hypercube design (LHC), as used to screen the uncertainty domain of five parameters of FRM inversion process. For convenience of DoE representation, the tolerance ranges of variables are converted to equidistant samples from [−1,1] interval. As indicated with the entries in parentheses in Table 5, the LHC design splits the uniform interval [−1, 1] to 16 equally spaced intervals, each of the width of 0.125. The values in parentheses correspond to multiplications of 0.125 by the integers between 1 and 16 and randomly assigned to sampled uncertain parameters.

TABLE 5

| | Example of three-level Design of Experiments (DoE) | | | | |
|---|---|---|---|---|---|
| Design | Fracture length | Variogram_major | Variogram_minor | Maximum_stress | Friction_factor |
| 1 | 829.91 (−0.375) | 10000.00 (1)* | 2590.08 (0.625) | 85.38 (−0.25) | 20.70 (−0.5) |
| 2 | 794.63 (−0.875) | 3718.82 (−0.5) | 3779.79 (0.75) | 84.84 (0.125) | 20.00 −(1) |
| 3 | 642.61 (−0.75) | 6742.96 (−0.125) | 4528.89 (−0.875) | 81.64 (−0.5) | 21.90 (0.25) |
| 4 | 559.04 (−0.625) | 3993.59 (0.25) | 4254.38 (−0.375) | 90.00 (1) | 21.80 (0.125) |
| 5 | 566.13 (0.5) | 4854.12 (0.875) | 3062.22 (−0.125) | 81.38 (−0.75) | 21.54 (−0.375) |
| 6 | 920.00 (1) | 4631.72 (−0.375) | 2099.35 (−0.25) | 83.72 (0.625) | 21.03 (−0.875) |
| 7 | 699.05 (0.25) | 5838.68 (−0.625) | 5500.00 (1) | 87.73 (−0.375) | 24.10 (0.75) |
| 8 | 791.56 (0.125) | 6679.16 (0.75) | 1897.34 | 86.39 (0.875) | 22.86 (0.625) |
| 9 | 500.00 (0) | 6500.00 (0) | 3500.00 (0) | 85.00 (0) | 22.50 (0) |
| 10 | 789.79 (0.375) | 3000.00 (−1) | 4634.17 (−0.625) | 88.75 (0.25) | 23.19 (0.5) |
| 11 | 603.27 (0.875) | 4272.63 (0.5) | 4907.89 (−0.75) | 82.15 (−0.125) | 25.00 (1) |
| 12 | 531.61 (0.75) | 3259.05 (0.125) | 3523.33 (0.875) | 84.75 (0.5) | 20.52 (−0.25) |
| 13 | 896.66 (0.625) | 7680.16 (−0.25) | 4331.80 (0.375) | 80.00 (−1) | 20.44 (−0.125) |
| 14 | 684.29 (−0.5) | 8598.49 (−0.875) | 1751.87 (0.125) | 85.87 (0.75) | 23.99 (0.375) |
| 15 | 480.00 (−1) | 5269.15 (0.375) | 1577.14 (0.25) | 89.12 (−0.625) | 20.55 (0.875) |
| 16 | 750.30 (−0.25) | 8690.46 (0.625) | 1500.00 (−1) | 81.42 (0.375) | 20.36 (−0.75) |
| 17 | 624.89 (−0.125) | 7496.44 (−0.75) | 3903.02 (−0.5) | 84.19 (−0.875) | 23.25 (−0.625) |

The modeling system 35 is configured to re-adjust (109a) the sampling distribution. The sampling distribution is re-fitted to sampled data based on the results of step 108 and step 109, using, for example, a variation of goodness-of-fit test (e.g. student's t-test), well known in the art.

The hypothesized sampling distributions are re-fitted or re-adjusted based on the result/efficiency of sampling during DoE runs. For parameters that demonstrate systematic undersampling of specific uncertainty intervals, the (min, max) boundaries and the number of intervals/bins (if needed) of hypothesized sampling distribution are adjusted to fit the boundaries sampled by DoE. The parameters that demonstrate uniform sampling within specified hypothesized distributions are left unchanged. Once the modeling system 35 as re-adjusted the sampling distribution according to step 109a, the FRM inversion process continues with methods to generate the updates of the geological model, DFNM and simulation model under uncertainty.

The modeling system 35 generates (200) a new realization of geo-model. The generation of the new realization of the geo-model is described in greater detail with respect to FIG. 7.

Figure 7:
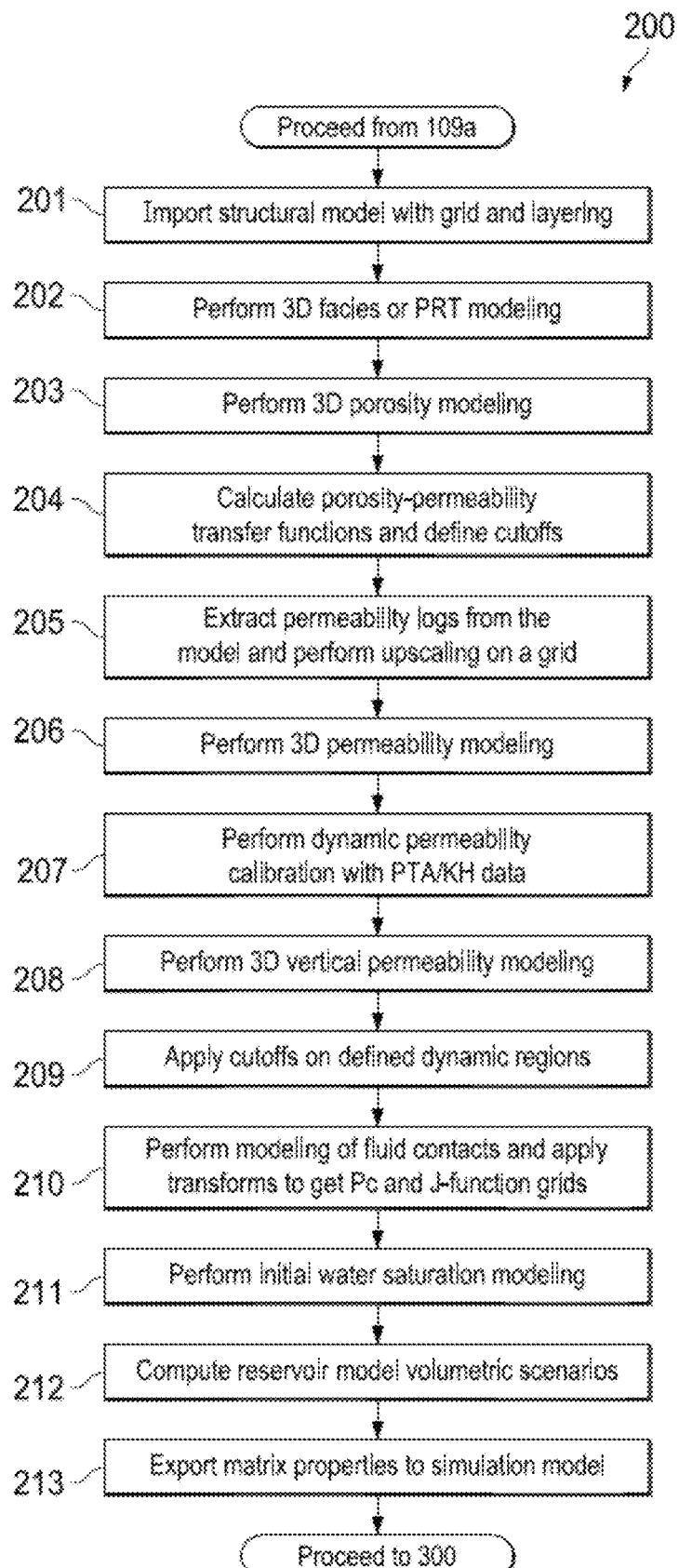
FIG. 7 shows a flowchart representing a process of generating the new realization of geo-model (GM).

Turning to FIG. 7, modeling system 35 is configured to perform process 200 to generate the new realization of the geo-model. The modeling system 35 is configured to import (201) a structural model. The structural model includes grid and layering data. The modeling system 35 is configured to perform (202) a 3D facies or PRT modeling. The modeling system 35 is configured to perform (203) 3D porosity modeling. The modeling system 35 is configured to determine (204) porosity-permeability transfer functions and define cutoffs. The modeling system 35 is configured to extract (205) permeability logs from the model and perform upscaling on a grid. The modeling system 35 is configured to perform (206) 3D permeability modeling on the grid. The modeling system 35 is configured to perform (207) dynamic permeability calibration with PTA/KH data. The modeling system 35 is configured to perform (208) 3D vertical permeability modeling. The modeling system 35 is configured to apply (209) cutoffs on defined dynamic regions. The modeling system 35 performs (210) modeling of fluid contacts and applies transforms to get Pc and J-function grids. The modeling system 35 performs (211) initial water saturation modeling. The modeling system 35 determines (212) reservoir model volumetric scenarios. The modeling system 35 exports (213) matrix properties to the simulation model.

In some implementations, the actions of steps 201 to 206 can be performed according to conventional processes. In some implementations, action 207 can be performed using methods and techniques as described U.S. Pub. No. 2017/0285221, incorporated in this disclosure in its entirety by reference. In some implementations, actions 208 to 213 can be performed by the modeling system 35 according to conventional processes.

Figure 8:
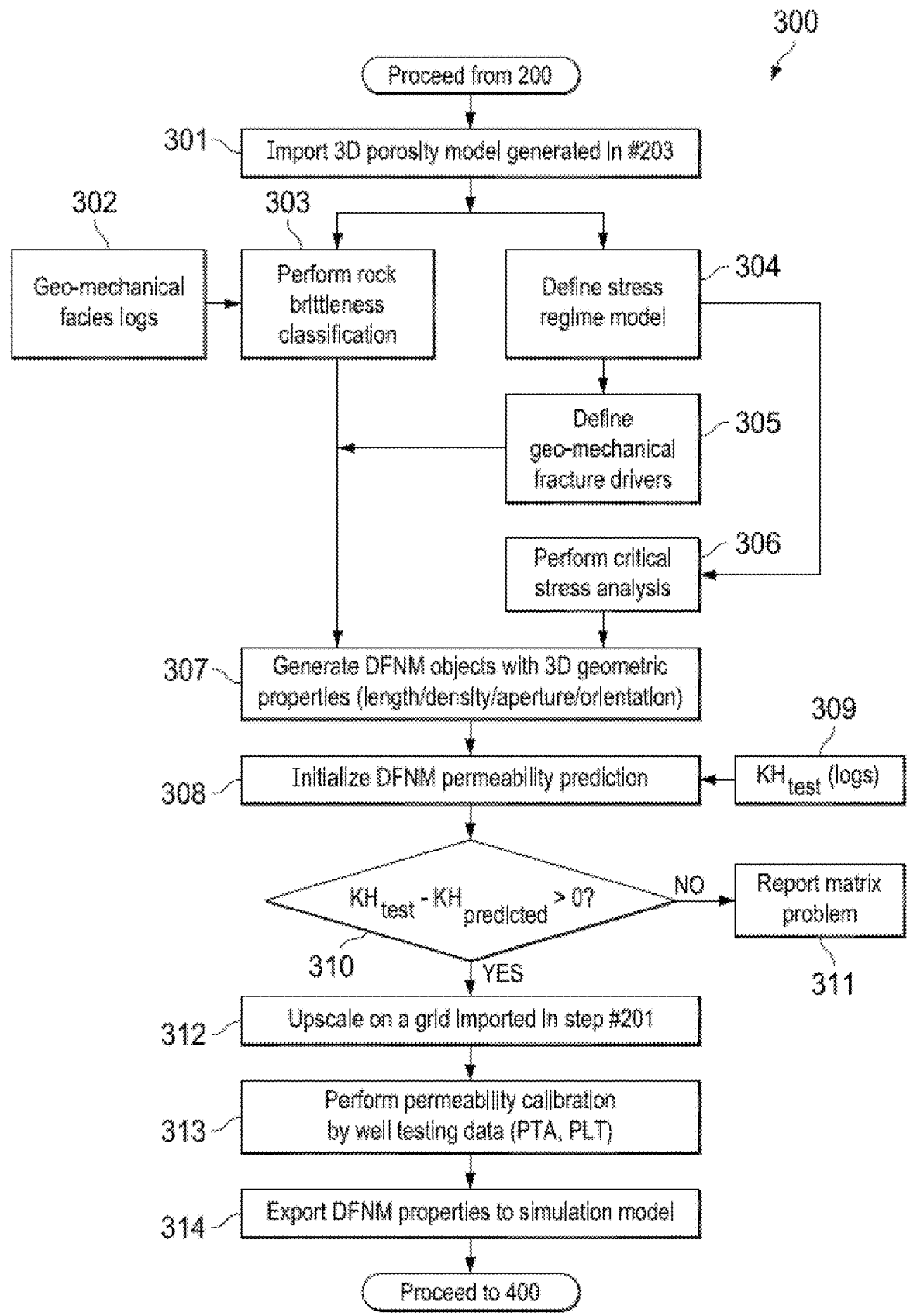
FIG. 8 shows a flowchart representing a process of generating the new realization of discrete fracture network model (DFNM).

Once the modeling system 35 has completed the actions of process 200, the modeling system 35 proceeds with the FRM inversion process according to process 300. Process 300 is described in relation to FIG. 8. The process 300 can be used to generate a new realization of the discrete fracture network model (DFNM). Turning to FIG. 8, the modeling system 35 is configured to import (301) the 3D porosity model generated in action 203. The modeling system 35 is configured to receive (302) geo-mechanical facies logs, for example, from storage. The modeling system 35 is configured to perform (303) rock brittleness classification, and define (304) a stress regime model. The modeling system 35 the defines (305) geo-mechanical fracture drivers and performs (306) a critical stress analysis. Once these modeling steps are performed, the modeling system 35 generates (307) the DFNM objects with 3D geometric properties, such as length, density, aperture, and orientation properties. The modeling system 35 initializes (308) the DFNM permeability prediction, such as using $KH_{test}$ logs received (309). Actions 302 to 308 can be performed using methods and techniques as described U.S. Pub. No. 2018/046824, incorporated in its entirety in this disclosure by reference. The modeling system 35 determines (310) whether the difference between the $KH_{test}$ value and a $KH_{predicted}$ value is positive, and reports (311) a matrix problem if the value is negative. The modeling system 35 then upscales (312) the model on the grid imported during action 201. In some implementations, actions 309 to 311 can be performed with conventional methods and techniques.

The modeling system 35 performs (313) a permeability calibration by well-testing the data, such as using PLA or PLT.

The modeling system 35 exports (314) the DFNM model including the generated properties to the simulation model. In some implementations, the action 314 can be performed with methods and techniques well known in art. An example of DFNM realization of fracture permeability and fracture network objects as generated by the method depicted in process 300 is shown in 3D DFNM fracture network representation 320 of FIG. 9A. For comparison, a fracture permeability array, as defined implicitly in the reservoir simulation model using conventional techniques of fracture indicators, is depicted in the representation 330 of FIG. 9B. More specifically, FIG. 9A includes an example of 3D DFNM realization 320 of fracture permeability (top view) and fracture network objects as generated by the method depicted in process 300. FIG. 9B includes an example of 3D fracture permeability array 330 (top view), as defined implicitly in the reservoir simulation model using conventional techniques of fracture indicators.

Figure 9A:
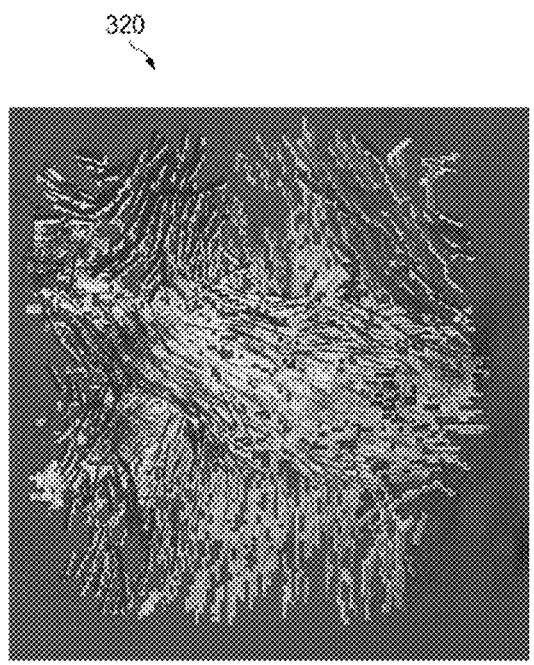
FIG. 9A shows a fracture model developed by an integrated DFNM approach.
Figure 9B:
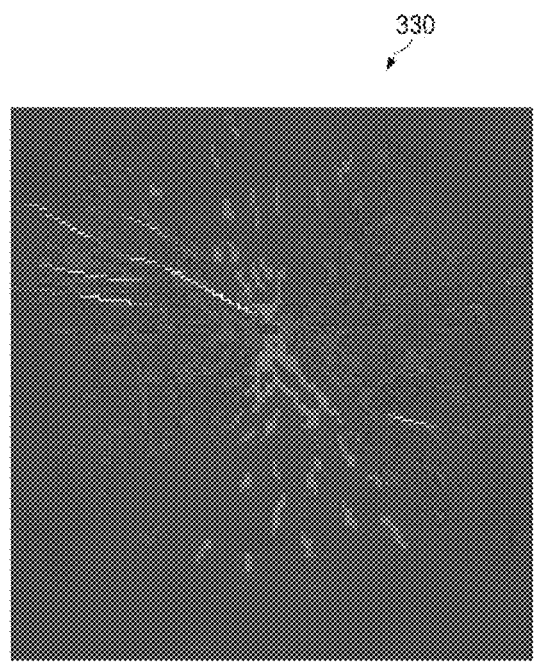
FIG. 9B shows a fracture model developed by a traditional approach with implicit embedding in reservoir simulation model.

For example, as per FIG. 9A, the stochastic DFN model realization 320 has the following differentiating characteristics from the conventional 3D fracture permeability array 330 of FIG. 9B. In some aspects, geometric dimensions (for example, length, length/height ratio, aperture, etc.) of the model and spatial distribution of fracture planes is accurately conditioned with underlying porosity distribution, paleo stress orientation and rock properties (e.g. brittleness). In some implementations, the fracture permeability is accurately calibrated with fracture aperture. The parameters involved in DFN modeling are modelled statistically with underlying distributions and as such incorporating a rigorous uncertainty quantification. The stochastic DFN modeling approach allows generating multiple realizations of DFN models and as such, robust representation of dynamic response uncertainty prior to stochastic inversion and optimization.

Figure 10:
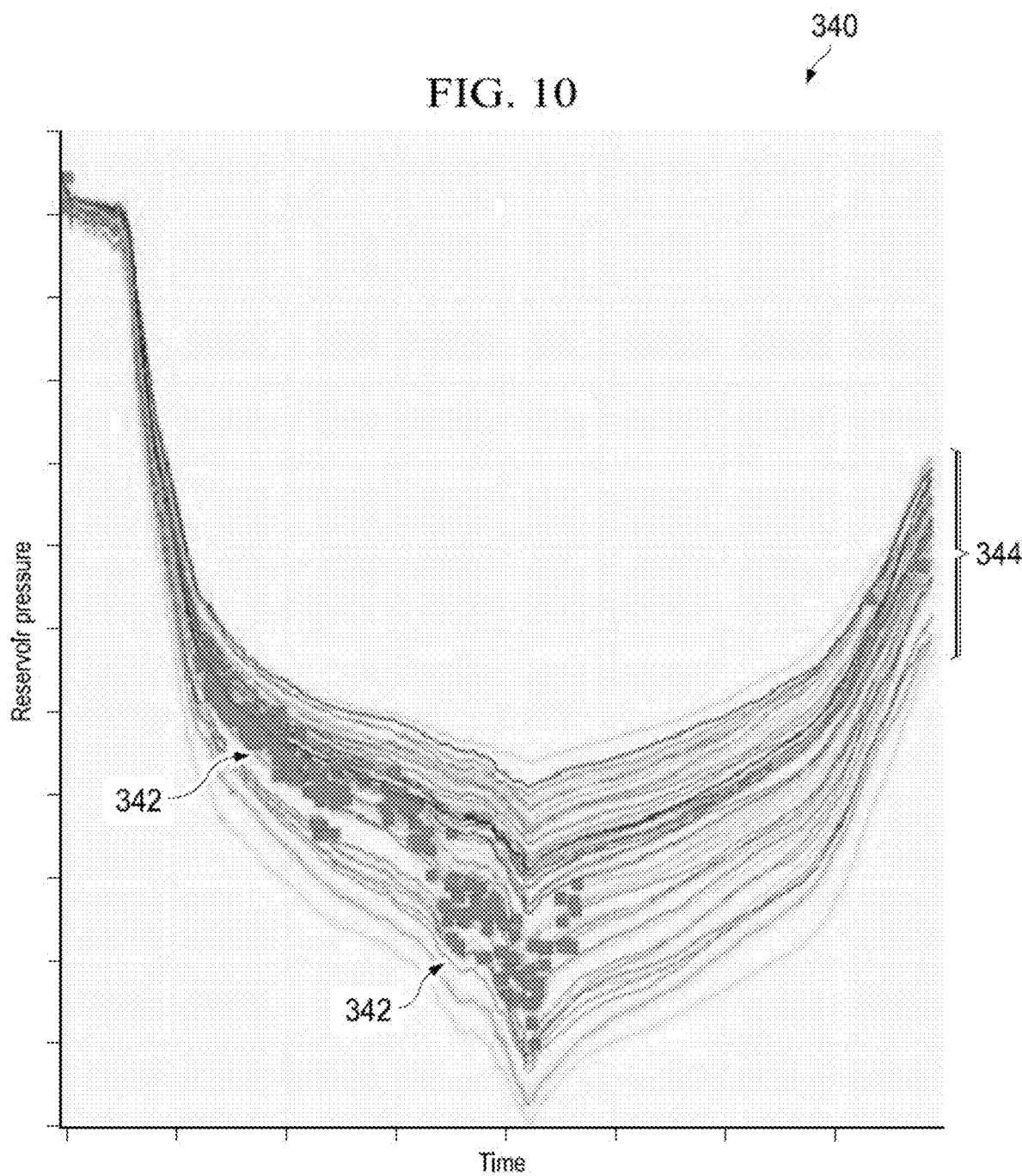
FIG. 10 shows an example of dynamic pressure response obtained by multiple stochastically generated DFN realizations.

For example, turning to FIG. 10, an example of dynamic pressure response obtained by multiple stochastically generated DFN realizations is shown in graph 340. Data points represented by squares 342 correspond to observed pressure data. Lines 344 correspond to simulated pressure responses. The objective of geology-consistent uncertainty quantification is to generate models (e.g. DFNM) that render dynamic response that capture (brackets) the observed data.

In contrast, the deterministic (manual) fracture model shown in FIG. 9B, defined implicitly in the simulation model, bears several respective deficiencies. For example, fracture properties (porosity, permeability and block-length) are defined as constant values, with no representation of parameter uncertainty. For example, conditioning of the deterministic fracture model to underlying porosity is significantly less robust. For example, an absence of stochastic modeling in the deterministic model does not allow a robust quantification of uncertainty via generating multiple realizations. For example, dynamic calibration of deterministic fracture models is mostly confined to manual history matching. For example, deterministic (manual) approach to fracture modeling renders a single fracture model realization and uncertainty quantification in dynamic response (as demonstrated in FIG. 10) is not feasible.

Figure 11:
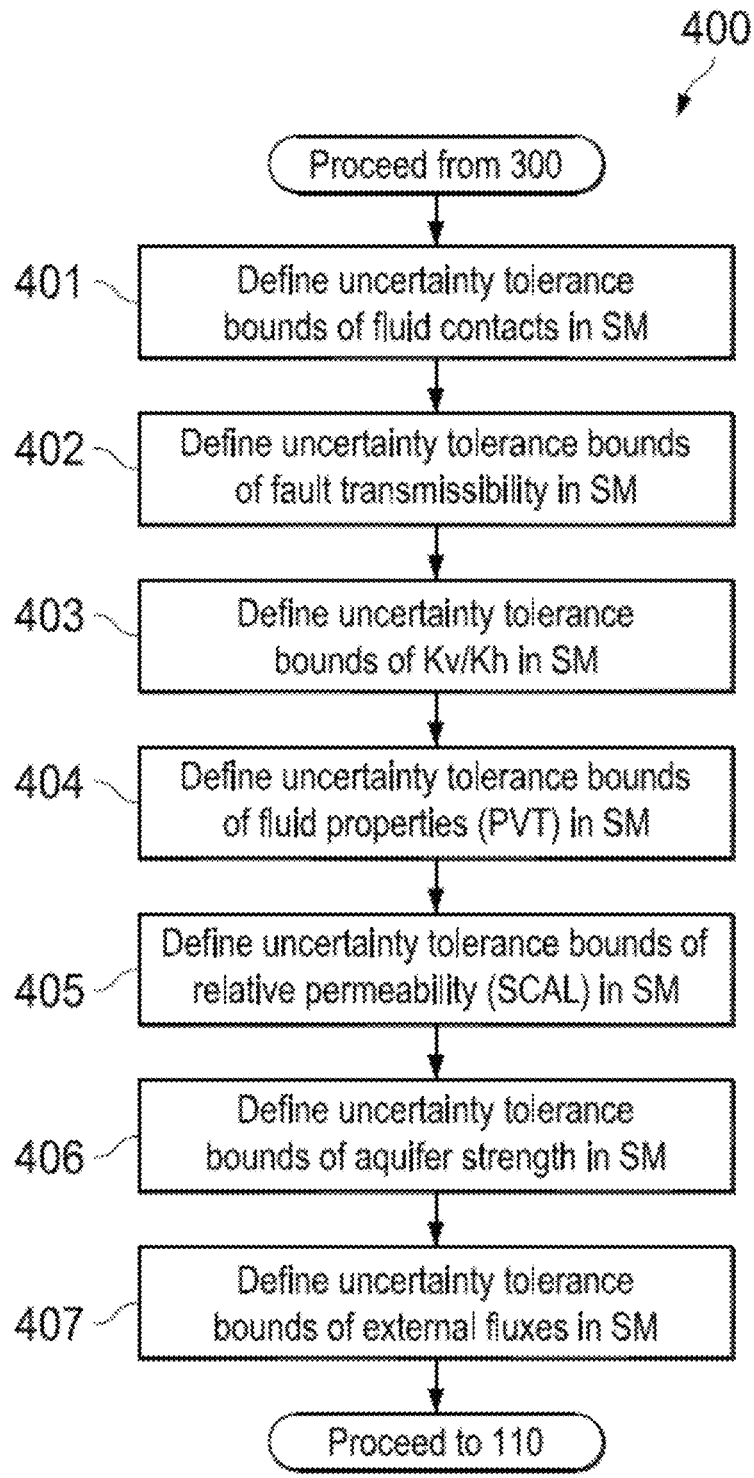
FIG. 11 shows a flowchart representing a process of generating a new scenario of a simulation model (SM).

Once process 300 is completed, the modeling system 35 proceeds in the FRM inversion process to process 400, depicted in FIG. 11. Turning to FIG. 11, a flowchart is shown including a process 400 of generating the new realization of simulation model. The modeling system 35 is configured to define (401) uncertainty tolerance bounds of fluid contacts in the simulation model. The modeling system 35 is configured to define (402) the uncertainty tolerance bounds of fault transmissibility in the simulation model. The modeling system 35 is configured to define (403) uncertainty tolerance bounds of Kv/Kh in the simulation model. The modeling system 35 is configured to define (404) uncertainty tolerance bounds of fluid properties (PVT) in the simulation model. The modeling system 35 is configured to define (406) uncertainty tolerance bounds of aquifer strength in simulation model. The modeling system 35 is configured to define (407) the uncertainty tolerance bounds of external fluxes in simulation model. Once the new realization of the geological model is generated by the modeling system 35 at process 200, the new realization of the DFNM is generated by the modeling system 35 at process 300, and the new realization of simulation model is generated by the modeling system 35 at process 400, the modeling system 35 proceeds to compute (110) the dynamic likelihood of FRM using the reservoir simulator, as shown in FIGS. 4A-4B.

In some implementations, actions in process 400 including actions 401 to 407, can be performed with methods and techniques well known in art. In some implementations, variations may occur due to different implementations of model building syntax, (for example, pertaining to a specific forward simulator). When completing process 400, the modeling system 35 proceeds in the FRM inversion process to action 110.

Returning to FIGS. 4A-4B, the dynamic likelihood of FRM can be computed by the modeling system 35 by performing a forward simulation, using computation techniques well known in art. When completing operation 110, the modeling system 35 proceeds to operation 112 in the FRM inversion process 100. The modeling system 35 is configured to define (112) the global misfit objective function (OF) subject to minimization in the AHM optimization study in a least-square term:

$$Q = (1-\mu)Q^{Likelihood} \mu Q^{Prior} \qquad (4)$$

where the term "prior" corresponds to the prior geo-model realization and the term "likelihood", corresponds to the validation of the prior term, using forward reservoir simulation.

The prior term of the objective function Q is usually defined on the large-scale, fine-resolution, geo-cellular grid of the 3D geo-model (with e.g. tens or hundreds of millions of grid cells), while the likelihood term is evaluated at control points of the measured/observed data, which are usually represented by the wells (producers, injectors), which, even in most complex cases, are measured in the order of (several) thousands. In some aspects, this leads to extreme dimensionality imbalances when comparing the prior and likelihood terms in the global objective function. Hence, due to practicality reasons, an additional weight factor $\mu$ is introduced to prioritize either contribution to the global objective function. In multi-Gaussian representation, the likelihood term of the objective function is generically defined as:

$$Q^{Likelihood} = \Sigma Q_i = \frac{\omega_i}{N_i} \Sigma_j^{N_i} \omega_i^j \frac{(sim_i^j - obs_i^j)^2}{\sigma_i^2} \qquad (5)$$

where terms "sim" and "obs" correspond to simulated and observed/measured data, respectively. Index i runs over the number of wells ($N_i$) or groups of wells ($G_i$) embedded in the misfit calculation, while index j runs over the number of time-steps used to discretize the time-scale of dynamic parameter (for example, well rate or pressure behavior in time).

The proposed FRM inversion process 100 defines several variations of the likelihood term of misfit objective function, that are interchangeably being used in different stages of the history matching:

$$Q^{WSWP} = \Sigma Q_i = \frac{\omega_i}{N_i} \Sigma_j^{N_i} \omega_i^j \frac{(WSWP_i^j - WSWPH_i^j)^2}{\sigma_i^2} \qquad (6)$$

$$Q^{GSWP} = \Sigma Q_i = \frac{\omega_i}{G_i} \Sigma_j^{G_i} \omega_i^j \frac{(GSWP_i^j - GSWPH_i^j)^2}{\sigma_i^2} \qquad (7)$$

$$Q^{WOPR} = \Sigma Q_i = \frac{\omega_i}{N_i} \Sigma_j^{N_i} \omega_i^j \frac{(WOPR_i^j - WOPRH_i^j)^2}{\sigma_i^2} \qquad (8)$$

$$Q^{WWPR} = \Sigma Q_i = \frac{\omega_i}{N_i} \Sigma_j^{N_i} \omega_i^j \frac{(WWPR_i^j - WWPRH_i^j)^2}{\sigma_i^2} \qquad (9)$$

$$Q^{WGPR} = \Sigma Q_i = \frac{\omega_i}{N_i} \Sigma_j^{N_i} \omega_i^j \frac{(WGPR_i^j - WGPRH_i^j)^2}{\sigma_i^2} \qquad (10)$$

$$Q^{GOPR} = \Sigma Q_i = \frac{\omega_i}{G_i} \Sigma_j^{G_i} \omega_i^j \frac{(GOPR_i^j - GOPRH_i^j)^2}{\sigma_i^2} \qquad (11)$$

$$Q^{GWPR} = \Sigma Q_i = \frac{\omega_i}{G_i} \Sigma_j^{G_i} \omega_i^j \frac{(GWPR_i^j - GWPRH_i^j)^2}{\sigma_i^2} \qquad (12)$$

$$Q^{GGPR} = \Sigma Q_i = \frac{\omega_i}{G_i} \Sigma_j^{G_i} \omega_i^j \frac{(GGPR_i^j - GGPRH_i^j)^2}{\sigma_i^2} \qquad (13)$$

$$Q^{WOPC} = \Sigma Q_i = \frac{\omega_i}{N_i} \Sigma_j^{N_i} \omega_i^j \frac{(WOPC_i^j - WOPCH_i^j)^2}{\sigma_i^2} \qquad (14)$$

$$Q^{WWPC} = \Sigma Q_i = \frac{\omega_i}{N_i} \Sigma_j^{N_i} \omega_i^j \frac{(WWPC_i^j - WWPCH_i^j)^2}{\sigma_i^2} \qquad (15)$$

$$Q^{GOPC} = \Sigma Q_i = \frac{\omega_i}{G_i} \Sigma_j^{G_i} \omega_i^j \frac{(GOPC_i^j - GOPCH_i^j)^2}{\sigma_i^2} \qquad (16)$$

$$Q^{GWPC} = \Sigma Q_i = \frac{\omega_i}{G_i} \Sigma_j^{G_i} \omega_i^j \frac{(GWPC_i^j - GWPCH_i^j)^2}{\sigma_i^2} \qquad (17)$$

$$Q^{WRFT} = \Sigma Q_i = \frac{\omega_i}{N_i} \Sigma_j^{N_i} \omega_i^j \frac{(WRFT_i^j - WRFTH_i^j)^2}{\sigma_i^2} \qquad (18)$$

$$Q^{WPLT} = \Sigma Q_i = \frac{\omega_i}{N_i} \Sigma_j^{N_i} \omega_i^j \frac{(WPLT_i^j - WPLTH_i^j)^2}{\sigma_i^2} \qquad (19)$$

The abbreviations stand for the following terms (in all "obs" terms, the "H" stands for historic data). WSWP includes well static well-head pressure. GSWP includes group static well-head pressure. WOPR includes well oil production rate. WWPR includes well water production rate. WGPR includes well gas production rate. GOPR includes group oil production rate. GWPR includes group water production rate. GGPR includes group gas production rate. WOPC includes well oil cumulative production. WWPC includes well water cumulative production. GOPC includes group oil cumulative production. GWPC includes group water cumulative production. WRFT includes well RFT/MDT pressure profile (measured at depth points, d). WPLT includes well flow-meter profile (measured at depth points, d).

In the FRM inversion process, the prior term of the misfit objective function is independent from the dynamic data. However in some instances, for example when the prior term involves the saturation derived by inverting time-lapse (4D seismic) data, the prior term may combine the time component as well. In generic multi-Gaussian notation, the prior term of the misfit objective function is given by:

$$Q_{Prior} = \Sigma_m (x_m - \bar{x}_m)^T [C_x^{Prior}]^{-1} (x_m - \bar{x}_m) \qquad (20)$$

where m represents an arbitrary prior model parameter, with $\bar{x}_m$ as mean or expected value. The prior covariance matrix is calculated for each grid-cell of the 3D geo-cellular grid. Traditionally, the model inversion methods for computer-Assisted History Matching (AHM) and dynamic model calibration define the prior term of the misfit objective function for the geo-model parameters, such as reservoir permeability, porosity, saturation etc. As a part of this ID, we introduce a novel form of the prior term $\tilde{Q}^{Prior}$, which combines the model parameters of the geological model and those of the DFNM:

$$\tilde{Q}^{Prior} = Q_{GM}^{Prior} \oplus Q_{DFNM}^{Prior} \qquad (21)$$

where:

$$Q_{GM}^{Prior} = \Sigma_m {}^{GM} (x_m^{GM} - \bar{x}_m^{GM})^T [C_x^{GM}]^{-1} (x_m^{GM} - \bar{x}_m^{DFNM}) \qquad (22)$$

$$Q_{DFNM}^{Prior} = \Sigma_m {}^{DFNM} (x_m^{DFNM} - \bar{x}_m^{DFNM})^T [C_x^{DFNM}]^{-1} (x_m^{DFNM} - \bar{x}_m^{DFNM}) \qquad (23)$$

Both, parameters of the geological model ($x_m^{GM}$) and those of the DFNM ($x_m^{DFNM}$) are represented as n-dimensional parameter vectors, $x_i$; i=1, . . . n.

Conventionally, the fracture model is defined implicitly in the reservoir simulation model by specifying a 3D distribution of fracture indicators that spatially represent the presence of the fracture in the grid. Such approach bears several approximations and limitations that diminish geological consistency of fracture model. For example, to reduce the spatial complexity, fractures usually are usually extended from top to bottom of the simulation grid. For example, fractures thickness usually retain the dimension of one grid-cell. For example, fracture properties (porosity, permeability, block-length (Lx, Ly, Lz) are usually assigned simplistically and without representative spatial variations.

In contrast, in process 100, the modeling system 35 includes a comprehensive set of seven parameters of the DFNM ($X_m^{DFNM}$) in the joint $\tilde{Q}^{Prior}$:

$$Q_{DFNM}^{Prior} = Q_{FRACPORO}^{DFNM} + Q_{FRACKX}^{DFNM} + Q_{FRACKY}^{DFNM} + Q_{FRACKZ}^{DFNM} + Q_{FRACLX}^{DFNM} + Q_{FRACLY}^{DFNM} + Q_{FRACLZ}^{DFNM} \qquad (24)$$

where fracture porosity (FRACPORO), fracture permeability in X-direction (FRACKX), fracture permeability in Y-direction (FRACKY), fracture permeability in Z-direction (FRACKZ), fracture block-length in X-direction (FRACLX), fracture block-length in Y-direction (FRACLY) and fracture block-length in Z-direction (FRACLZ) are all represented as independent 3D grid properties generated by the method described in process 300 in relation to FIG. 8.

In some implementations, 3D grid distribution of matrix-fracture mass transfer coefficient ($\sigma$), a.k.a. "shape factor" is calculated by the modeling system 35 by the forward simulator using FRACLX, FRACLY and FRACLZ as the input parameters. In some implementations, modeling system 35 performs these calculations using methods and techniques known in art, such as Equation 25, though other methods and techniques as alternative to equation 25 are possible.

$$\sigma = 4 \left( \frac{KX}{FRACLX^2} + \frac{KY}{FRACLY^2} + \frac{KZ}{FRACLZ^2} \right) \qquad (25)$$

At action 114 of process 100, the modeling system 35, with this new definition of joint the geological model and DFNM definition of the prior term, defines the global objective function as $\tilde{Q} = (1-\mu) Q^{Likelihood} + \mu \tilde{Q}^{Prior}$ and evaluates and minimizes it in the process of AHM optimization (114).

The modeling system 35 performs (114) the minimization of global objective function $\tilde{Q}$ is performed by the use of Covariance Matrix Adaptation Evolution Strategy (CMA-ES) multi-objective optimization algorithm. In some implementations, CMA-ES includes a series of operations known in art. In the ES algorithm, a mutation of uncertainty parameters represents the dominant operation. Hence, by sampling from uncertainty distributions of main design drivers for variability of prior model parameters (for example, listed in Table 3), the ES algorithm modifies and updates the reservoir parameter with the step size which are varied in each iteration of the optimization process based on normally distributed random numbers. Hence, in FRM inversion presented in this ID, the parameters of the geological model ($x_m^{GM}$) and those of the DFNM ($x_m^{DFNM}$) are updated by adding a random number generated from the normal distribution N(0, $\sigma_i^2$) with $\sigma$ as standard deviation:

$$\sigma_i' = \sigma_i e^{[\tau' N(0,1) + \tau N_i(0,1)]} \qquad (26)$$

$$x_i^{GM'} = x_i^{GM} + \sigma_i' N_i(0,1) \qquad (27)$$

$$x_i^{DFNM'} = x_i^{DFNM} + \sigma_i' N_i(0,1) \qquad (28)$$

$\tau'$ and $\tau$ represent overall learning and coordinated wise learning rates, respectively. They are typically given by:

$$\tau' = 1/(\sqrt{2\sqrt{n}})$$

and $\tau = 1/2n$.

Once the modeling system 35 has performed the minimization, the modeling system 35 selects (115) a new sample from simulation model distributions, selects (116) a new sample from DFNM distributions, and selects (117) a new sample from the geological model distributions for the next iteration.

The process 100 of FRM inversion is iteratively repeated by the modeling system 35 in a Closed-Loop scheme, including processes 200, 300, and 400, and operations 110, 112, 113, 114, 115, 116 and 117, until the global misfit objective function $\tilde{Q}$ is significantly and acceptably reduced or minimized.

In absolute terms, the acceptable levels of global misfit are case dependent. However, the rate of global misfit reduction as a function of computation iterations is monitored. For example, turning to FIG. 12, a graph 410 is shown which demonstrates a history matching simulation case where the global objective function has reduced by 80% (to 20% of its initial misfit value in iteration 1) over 5 iterations, which can be designated as a case of successful convergence (for example, a reduction of global misfit function). Generally, not every history matching simulation case demonstrates such convergence. Hence, the acceptable level of global misfit reduction is case dependent.

Figure 12:
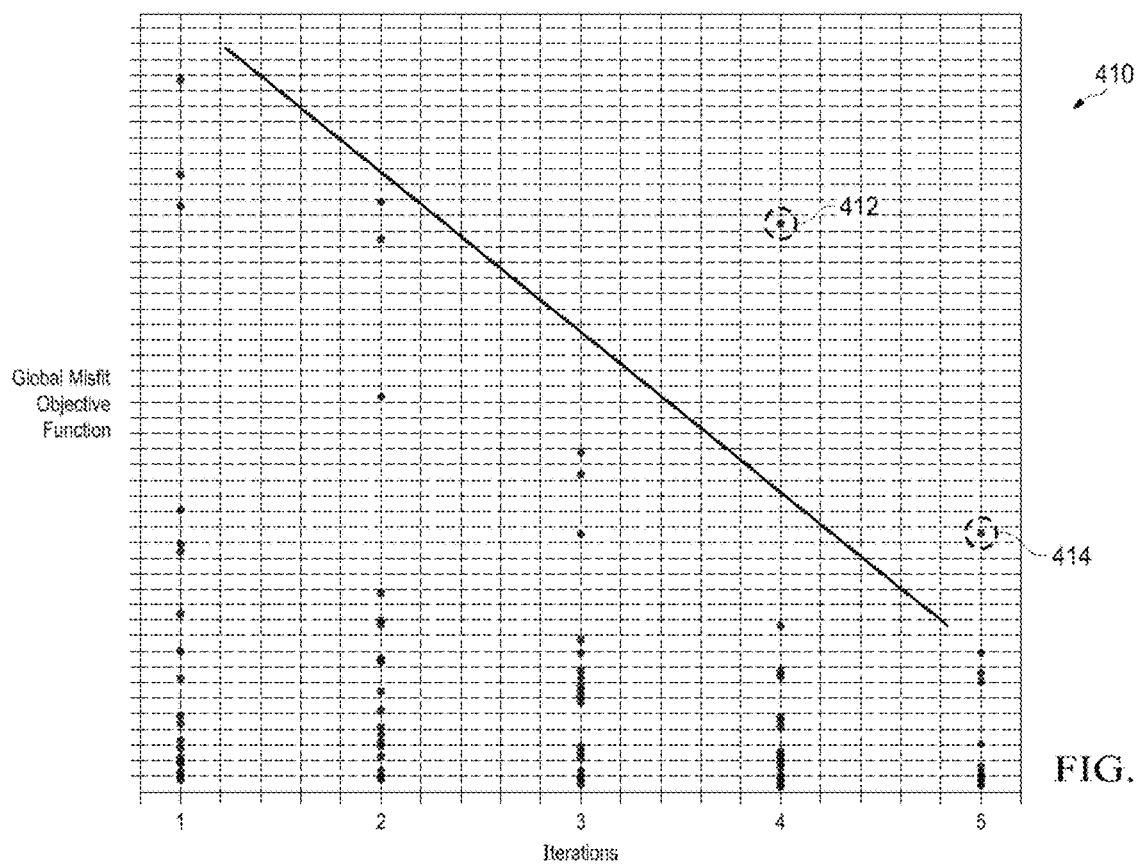
FIG. 12 shows a monotonic decrease of global misfit objective function with increasing number of iterations.

More specifically, FIG. 12 shows a monotonic decrease of global misfit objective function with increasing number of iterations. The circled scenarios 412, 414 represent statistical outliers. The reduction in global misfit objective function results in significantly reduced variability and improvement of history match quality per analyzed well response.

Figure 13:
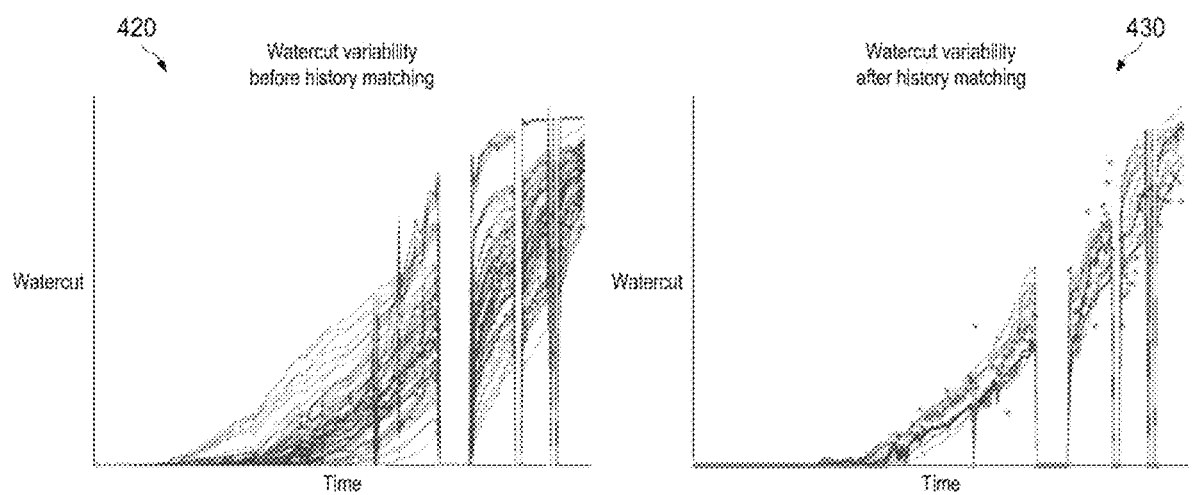
FIG. 13 shows example scenarios for well water-cut dynamic response.

Turning to FIG. 13, a graphs 420, 430 show an example scenario for well watercut dynamic response. Graph 420 shows a variability in watercut dynamic response obtained with prior (before history matching) ensemble of 75 FRM model realizations, such as generated by the modeling system 35 at action 109 in of process 100 described in relation to FIGS. 4A-4B. Graph 430 shows variability in watercut dynamic response of posterior (after history matching) ensemble, obtained with 25 FRM realizations generated, such as generated by the modeling system 35 during action 114 of process 100, described in relation to FIGS. 4A-4B.

An example of significantly reduced global misfit objective function (OF) in the process 100 of FRM inversion is shown by the graphs 440, 450 in FIG. 14. The analysis of FIG. 14 confirms that the use of multi-objective CMA-ES optimization was able to reduce the mean of the global misfit OF (in other words, increase accuracy) by a factor of 10 and reduce the standard deviation of the global misfit OF (in other words, increase precision) by a factor of 70. It need to be noted that the use of CMA-ES optimization is not exclusive for implementation of FRM inversion as disclosed in this ID. Alternative methods and techniques, well known in art like Markov chain Monte Carlo (McMC) may be used.

Box 442 of graph 440 shows an initial group of 4 FRM scenarios (pre AHM optimization) with the lowest global misfit objective function identified in operation 109 of process 100, described in relation to FIGS. 4A-4B. Box 444 of graphs 440, 450 includes a final group of 8 FRM scenarios (post AHM optimization). Graph 450 is an exploded view of box 444 in graph 440. The lowest global misfit objective function is identified by the modeling system 35 after performing 12 iterations of closed-loop FRM inversion (for example, including processes 200, 300, 400, and operations 110, 112, 113, 114, 115, 116, and 117).

Returning to FIGS. 4A-4B, when significant reduction or minimization of global objective function is achieved (reduction below a specified threshold), the modeling system 35 ends (118) the history matching process. The modeling system 35 is configured to rank (119) the history matched models based on the global misfit objective function (see, for example, FIG. 14) and the selected models are propagated (120) by the modeling system 35 to production forecasting under uncertainty. Alternatively, dynamic model ranking or min-max optimization can be used to select and rank for production forecasting.

Figure 15:
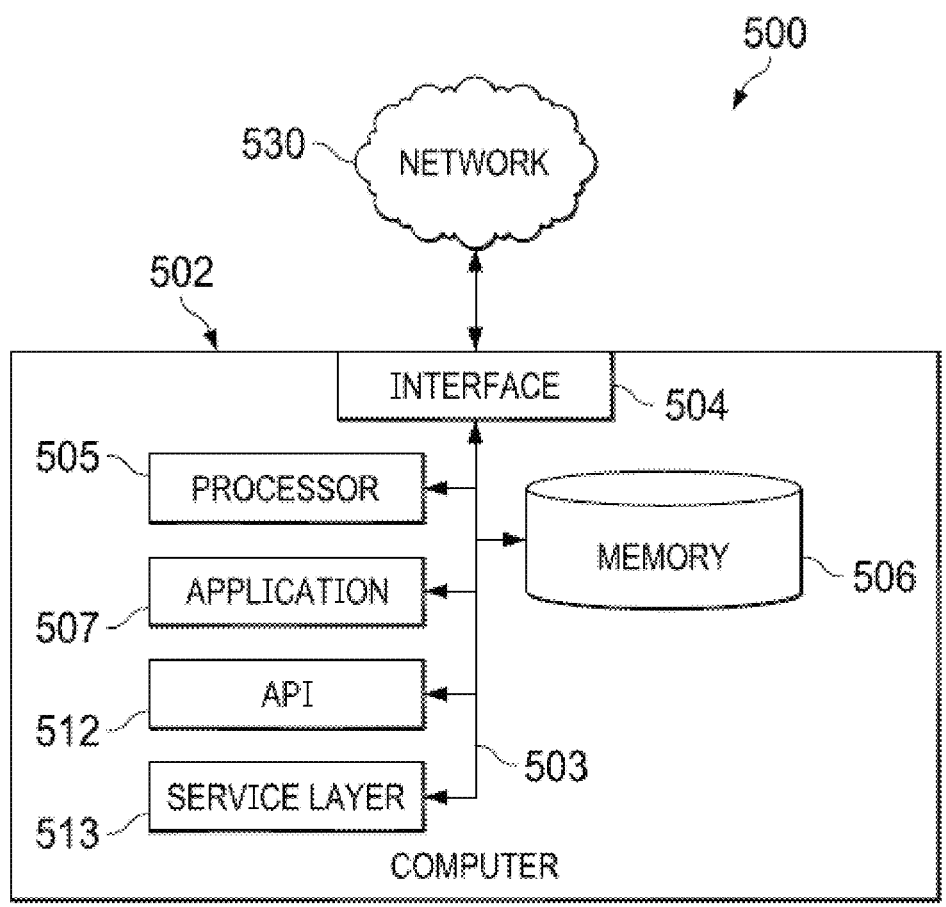
FIG. 15 shows a block diagram of an exemplary computer system used to provide computational functionalities associated with described algorithms, methods, functions, processes, flows, and procedures as described in the instant disclosure, according to an implementation.

FIG. 15 depicts a block diagram of an exemplary computer system 500 used to provide computational functionalities associated with described algorithms, methods, functions, processes, flows, and procedures as described in the instant disclosure, according to an implementation. The illustrated computer 502 is intended to encompass any computing device such as a server, desktop computer, laptop or notebook computer, wireless data port, smart phone, personal data assistant (PDA), tablet computing device, or one or more processors within these devices, including both physical or virtual instances (or both) of the computing device. Additionally, the computer 502 may comprise a computer that includes an input device, such as a keypad, keyboard, touch screen, or other device that can accept user information, and an output device that conveys information associated with the operation of the computer 502, including digital data, visual, or audio information (or a combination of information), or a GUI.

The computer 502 can serve in a role as a client, network component, a server, a database or other persistency, or any other component (or a combination of roles) of a computer system for performing the subject matter described in the instant disclosure. The illustrated computer 502 is communicably coupled with a network 530. In some implementations, one or more components of the computer 502 may be configured to operate within environments, including cloud-computing-based, local, global, or a combination of environments.

At a high level, the computer 502 is an electronic computing device operable to receive, transmit, process, store, or manage data and information associated with the described subject matter. According to some implementations, the computer 502 may also include or be communicably coupled with an application server, e-mail server, web server, caching server, streaming data server, business intelligence (BI) server, or other server (or a combination of servers).

The computer 502 can receive requests over network 530 from a client application (for example, executing on another computer 502) and responding to the received requests by processing the said requests in a software application. In addition, requests may also be sent to the computer 502 from internal users (for example, from a command console or by other access method), external or third parties, other automated applications, as well as any other entities, individuals, systems, or computers.

Each of the components of the computer 502 can communicate using a system bus 503. In some implementations, any or all of the components of the computer 502, both hardware or software (or a combination of hardware and software), may interface with each other or the interface 504 (or a combination of both) over the system bus 503 using an application programming interface (API) 512 or a service layer 513 (or a combination of the API 512 and service layer 513). The API 512 may include specifications for routines, data structures, and object classes. The API 512 may be either computer-language independent or dependent and refer to a complete interface, a single function, or even a set of APIs. The service layer 513 provides software services to the computer 502 or other components (whether or not illustrated) that are communicably coupled to the computer 502. The functionality of the computer 502 may be accessible for all service consumers using this service layer. Software services, such as those provided by the service layer 513, provide reusable, defined business functionalities through a defined interface. For example, the interface may be software written in JAVA, C++, or other suitable language providing data in extensible markup language (XML) format or other suitable format. While illustrated as an integrated component of the computer 502, alternative implementations may illustrate the API 512 or the service layer 513 as stand-alone components in relation to other components of the computer 502 or other components (whether or not illustrated) that are communicably coupled to the computer 502. Moreover, any or all parts of the API 512 or the service layer 513 may be implemented as child or sub-modules of another software module, enterprise application, or hardware module without departing from the scope of this disclosure.

The computer 502 includes an interface 504. Although illustrated as a single interface 504, two or more interfaces 504 may be used according to particular needs, desires, or particular implementations of the computer 502. The interface 504 is used by the computer 502 for communicating with other systems in a distributed environment that are connected to the network 530 (whether illustrated or not). Generally, the interface 504 comprises logic encoded in software or hardware (or a combination of software and hardware) and operable to communicate with the network 530. More specifically, the interface 504 may comprise software supporting one or more communication protocols associated with communications such that the network 530 or interface's hardware is operable to communicate physical signals within and outside of the illustrated computer 502.

The computer 502 includes a processor 505. Although illustrated as a single processor 505, two or more processors may be used according to particular needs, desires, or particular implementations of the computer 502. Generally, the processor 505 executes instructions and manipulates data to perform the operations of the computer 502 and any algorithms, methods, functions, processes, flows, and procedures as described in the instant disclosure.

The computer 502 also includes a memory 506 that holds data for the computer 502 or other components (or a combination of both) that can be connected to the network 530 (whether illustrated or not). For example, memory 506 can be a database storing data consistent with this disclosure. Although illustrated as a single memory 506, two or more memories may be used according to particular needs, desires, or particular implementations of the computer 502 and the described functionality. While memory 506 is illustrated as an integral component of the computer 502, in alternative implementations, memory 506 can be external to the computer 502.

The application 507 is an algorithmic software engine providing functionality according to particular needs, desires, or particular implementations of the computer 502, particularly with respect to functionality described in this disclosure. For example, application 507 can serve as one or more components, modules, or applications. Further, although illustrated as a single application 507, the application 507 may be implemented as multiple applications 507 on the computer 502. In addition, although illustrated as integral to the computer 502, in alternative implementations, the application 507 can be external to the computer 502.

There may be any number of computers 502 associated with, or external to, a computer system containing computer 502, each computer 502 communicating over network 530. Further, the term "client," "user," and other terminology may be used interchangeably as without departing from the scope of this disclosure. Moreover, this disclosure contemplates that many users may use one computer 502, or that one user may use multiple computers 502.

Implementations of the subject matter and the functional operations described in this specification can be implemented in digital electronic circuitry, in tangibly embodied computer software or firmware, in computer hardware, including the structures disclosed in this specification and their structural equivalents, or in combinations of one or more of them. Implementations of the subject matter described in this specification can be implemented as one or more computer programs, that is, one or more modules of computer program instructions encoded on a tangible, non-transitory, computer-readable computer-storage medium for execution by, or to control the operation of, data processing apparatus. Alternatively or in addition, the program instructions can be encoded on an artificially generated propagated signal, for example, a machine-generated electrical, optical, or electromagnetic signal that is generated to encode information for transmission to suitable receiver apparatus for execution by a data processing apparatus. The computer-storage medium can be a machine-readable storage device, a machine-readable storage substrate, a random or serial access memory device, or a combination of computer-storage mediums.

The terms "data processing apparatus," "computer," or "electronic computer device" (or equivalent as understood by one of ordinary skill in the art) refer to data processing hardware and encompass all kinds of apparatus, devices, and machines for processing data. Such devices can include, for example, a programmable processor, a computer, or multiple processors or computers. The apparatus can also be or further include special purpose logic circuitry, for example, a central processing unit (CPU), a field programmable gate array (FPGA), or an application-specific integrated circuit (ASIC). In some implementations, the data processing apparatus or special purpose logic circuitry (or a combination of the data processing apparatus or special purpose logic circuitry) may be hardware- or software-based (or a combination of both hardware- and software-based). The apparatus can optionally include code that creates an execution environment for computer programs, for example, code that constitutes processor firmware, a protocol stack, a database management system, an operating system, or a combination of execution environments. The present disclosure contemplates the use of data processing apparatuses with or without conventional operating systems, for example, LINUX, UNIX, WINDOWS, MAC OS, ANDROID, IOS or any other suitable conventional operating system.

A computer program, which may also be referred to or described as a program, software, a software application, a module, a software module, a script, or code, can be written in any form of programming language, including compiled or interpreted languages, or declarative or procedural languages, and it can be deployed in any form, including as a stand-alone program or as a module, component, subroutine, or other unit suitable for use in a computing environment. A computer program may, but need not, correspond to a file in a file system. A program can be stored in a portion of a file that holds other programs or data, for example, one or more scripts stored in a markup language document, in a single file dedicated to the program in question, or in multiple coordinated files, for example, files that store one or more modules, sub-programs, or portions of code. A computer program can be deployed to be executed on one computer or on multiple computers that are located at one site or distributed across multiple sites and interconnected by a communication network. While portions of the programs illustrated in the various figures are shown as individual modules that implement the various features and functionality through various objects, methods, or other processes, the programs may instead include a number of sub-modules, third-party services, components, or libraries. Conversely, the features and functionality of various components can be combined into single components.

The processes and logic flows described in this specification can be performed by one or more programmable computers executing one or more computer programs to perform functions by operating on input data and generating output. The processes and logic flows can also be performed by, and apparatus can also be implemented as, special purpose logic circuitry, for example, a CPU, an FPGA, or an ASIC.

Computers suitable for the execution of a computer program can be based on general or special purpose microprocessors, both, or any other kind of CPU. Generally, a CPU will receive instructions and data from a read-only memory (ROM) or a random access memory (RAM) or both. The essential elements of a computer are a CPU for performing or executing instructions and one or more memory devices for storing instructions and data. Generally, a computer will also include, or be operatively coupled to, receive data from or transfer data to, or both, one or more mass storage devices for storing data, for example, magnetic, magneto-optical disks, or optical disks. However, a computer need not have such devices. Moreover, a computer can be embedded in another device, for example, a mobile telephone, a personal digital assistant (PDA), a mobile audio or video player, a game console, a global positioning system (GPS) receiver, or a portable storage device, for example, a universal serial bus (USB) flash drive, to name just a few.

Computer-readable media (transitory or non-transitory) suitable for storing computer program instructions and data include all forms of non-volatile memory, media and memory devices, including by way of example semiconductor memory devices, for example, erasable programmable read-only memory (EPROM), electrically erasable programmable read-only memory (EEPROM), and flash memory devices; magnetic disks, for example, internal hard disks or removable disks; magneto-optical disks; and compact disc read-only memory (CD-ROM), Digital Versatile Disc (DVD)+/−R, DVD-RAM, and DVD-ROM disks. The memory may store various objects or data, including caches, classes, frameworks, applications, backup data, jobs, web pages, web page templates, database tables, repositories storing dynamic information, and any other information including any parameters, variables, algorithms, instructions, rules, constraints, or references thereto. Additionally, the memory may include any other data, such as logs, policies, security or access data, or reporting files. The processor and the memory can be supplemented by, or incorporated in, special purpose logic circuitry.

To provide for interaction with a user, implementations of the subject matter described in this specification can be implemented on a computer having a display device, for example, a cathode ray tube (CRT), liquid crystal display (LCD), Light Emitting Diode (LED), or plasma monitor, for displaying information to the user and a keyboard and a pointing device, for example, a mouse, trackball, or trackpad, by which the user can provide input to the computer. Input may also be provided to the computer using a touchscreen, such as a tablet computer surface with pressure sensitivity, a multi-touch screen using capacitive or electric sensing, or other type of touchscreen. Other kinds of devices can be used to provide for interaction with a user as well; for example, feedback provided to the user can be any form of sensory feedback, for example, visual feedback, auditory feedback, or tactile feedback; and input from the user can be received in any form, including acoustic, speech, or tactile input. In addition, a computer can interact with a user by sending documents to and receiving documents from a device that is used by the user; for example, by sending web pages to a web browser on a user's client device in response to requests received from the web browser.

The term graphical user interface (GUI) may be used in the singular or the plural to describe one or more graphical user interfaces and each of the displays of a particular graphical user interface. Therefore, a GUI may represent any graphical user interface, including but not limited to, a web browser, a touch screen, or a command line interface (CLI) that processes information and efficiently presents the information results to the user. In general, a GUI may include a plurality of user interface (UI) elements, some or all associated with a web browser, such as interactive fields, pull-down lists, and buttons operable by the business suite user. These and other UI elements may be related to or represent the functions of the web browser.

Implementations of the subject matter described in this specification can be implemented in a computing system that includes a back-end component, for example, as a data server, or that includes a middleware component, for example, an application server, or that includes a front-end component, for example, a client computer having a graphical user interface or a Web browser through which a user can interact with an implementation of the subject matter described in this specification, or any combination of one or more such back-end, middleware, or front-end components. The components of the system can be interconnected by any form or medium of wireline or wireless digital data communication (or a combination of data communication), for example, a communication network. Examples of communication networks include a local area network (LAN), a radio access network (RAN), a metropolitan area network (MAN), a wide area network (WAN), Worldwide Interoperability for Microwave Access (WIMAX), a wireless local area network (WLAN) using, for example, 502.11 a/b/g/n or 502.20 (or a combination of 502.11x and 502.20 or other protocols consistent with this disclosure), all or a portion of the Internet, or any other communication system or systems at one or more locations (or a combination of communication networks). The network may communicate with, for example, Internet Protocol (IP) packets, Frame Relay frames, Asynchronous Transfer Mode (ATM) cells, voice, video, data, or other suitable information (or a combination of communication types) between network addresses.

The computing system can include clients and servers. A client and server are generally remote from each other and typically interact through a communication network. The relationship of client and server arises by virtue of computer programs running on the respective computers and having a client-server relationship to each other.

In some implementations, any or all of the components of the computing system, both hardware or software (or a combination of hardware and software), may interface with each other or the interface using an API or a service layer (or a combination of API and service layer). The API may include specifications for routines, data structures, and object classes. The API may be either computer language independent or dependent and refer to a complete interface, a single function, or even a set of APIs. The service layer provides software services to the computing system. The functionality of the various components of the computing system may be accessible for all service consumers using this service layer. Software services provide reusable, defined business functionalities through a defined interface. For example, the interface may be software written in JAVA, C++, or other suitable language providing data in extensible markup language (XML) format or other suitable format. The API or service layer (or a combination of the API and the service layer) may be an integral or a stand-alone component in relation to other components of the computing system. Moreover, any or all parts of the service layer may be implemented as child or sub-modules of another software module, enterprise application, or hardware module without departing from the scope of this disclosure.

While this specification contains many specific implementation details, these should not be construed as limitations on the scope of the described system or on the scope of what may be claimed, but rather as descriptions of features that may be specific to particular implementations. Certain features that are described in this specification in the context of separate implementations can also be implemented in combination in a single implementation. Conversely, various features that are described in the context of a single implementation can also be implemented in multiple implementations separately or in any suitable sub-combination. Moreover, although features may be described earlier as acting in certain combinations and even initially claimed as such, one or more features from a claimed combination can in some cases be excised from the combination, and the claimed combination may be directed to a sub-combination or variation of a sub-combination.

Particular implementations of the subject matter have been described. Other implementations, alterations, and permutations of the described implementations are within the scope of the following claims as will be apparent to those skilled in the art. While operations are depicted in the drawings or claims in a particular order, this should not be understood as requiring that such operations be performed in the particular order shown or in sequential order, or that all illustrated operations be performed (some operations may be considered optional), to achieve desirable results. In certain circumstances, multitasking or parallel processing (or a combination of multitasking and parallel processing) may be advantageous and performed.

Moreover, the separation or integration of various system modules and components in the implementations described earlier should not be understood as requiring such separation or integration in all implementations, and it should be understood that the described program components and systems can generally be integrated together in a single software product or packaged into multiple software products.

Accordingly, the earlier description of example implementations does not define or constrain this disclosure. Other changes, substitutions, and alterations are also possible without departing from the spirit and scope of this disclosure.

Furthermore, any claimed implementation described later is considered to be applicable to at least a computer-implemented method, a non-transitory, computer-readable medium storing computer-readable instructions to perform the computer-implemented method, and a computer system comprising a computer memory interoperably coupled with a hardware processor configured to perform the computer-implemented method or the instructions stored on the non-transitory, computer-readable medium.

What is claimed is:

1. A computer-implemented method for generating a fractured reservoir model executed by one or more processors, the method comprising:

receiving a seismic dataset of a surveyed subsurface, the seismic dataset comprising a set of parameters representing physical features of the surveyed subsurface;

identifying a dynamic response of each parameter of the set of parameters, wherein each parameter of the set is associated with a range of values;

selecting a subset of parameters from the set of parameters based on the dynamic response of each parameter;

sampling an outer boundary of a parameter uncertainty domain, the parameter uncertainty domain based on the range of values for each parameter of the subset of parameters;

adjusting the range of values associated with each parameter of the subset based on the sampling;

generating a geo-model based on the adjusted range of values associated with each parameter of the subset;

generating a discrete fracture network model based on the geo-model;

generating a scenario of a simulation model based on the discrete fracture network model and the geo-model;

performing a forward simulation based on the scenario of the simulation model;

determining that a misfit of the forward simulation is below a threshold by evaluating an objective function; and producing a three-dimensional (3D) model based on the forward simulation;

in response to determining that the misfit of the forward simulation is not below the threshold:

redefining the objective function by an assisted history matching process in which a new parameter uncertainty domain is sampled for each of the geo-model, the discrete fracture network model, and the scenario of a simulation model; and generating a history matched model based on the redefined objective function.

2. A computer-implemented method of claim 1, wherein identifying a dynamic response of one or more parameters of the set of parameters comprises:

assigning one or more of a tolerance value range and a probability sampling distribution to each parameter of the set of parameters based on the uncertainty domain associated with each parameter;

determining a sensitivity metric for each of the parameters based on the one or more of the tolerance value range and the probability sampling distribution of each of the parameters;

ranking the parameters of the set of parameters based on the sensitivity metric associated with each of the parameters; and selecting, from the set of the parameters, the subset of parameters including one or more higher ranked parameters, the one or more higher ranked parameters representing higher contribution to the dynamic response of the fractured reservoir model than one or more lower ranked parameters of the set of parameters.

3. A computer-implemented method of claim 2, wherein assigning the one or more of the tolerance value range and the probability sampling distribution is based on selected types of basin geology and sedimentology associated with the seismic dataset.

4. A computer-implemented method of claim 1, wherein sampling the outer boundary of the parameter uncertainty domain comprises a two level design of experiments (DoE) process.

5. A computer-implemented method of claim 4, further comprising refining the sampling based on a three level design of experiments (DoE) process.

6. A computer-implemented method of claim 1, wherein the set of parameters is selected from a group consisting of permeability, porosity, fracture density, fracture intensity, fracture geometry, fracture aperture, fracture orientation, stress, pore pressure, fluid contacts, fault transmissibility, a vertical to horizontal permeability (Kv/Kh) ratio, fluid properties, and aquifer strength.

7. A computer-implemented method of claim 1, wherein generating the scenario of a simulation model based on the discrete fracture network model and the geo-model comprises:
   defining uncertainty tolerance range of fluid contacts in the simulation model;
   defining uncertainty tolerance range of fault transmissibility in the simulation model;
   defining uncertainty tolerance range of a vertical to horizontal permeability (Kv/Kh) ratio in the simulation model;
   defining uncertainty tolerance range of fluid properties (PVT) in the simulation model;
   defining uncertainty tolerance range of aquifer strength in the simulation model; and
   defining uncertainty tolerance range of external fluxes in the simulation model.

8. A computer-implemented method of claim 1, further comprising generating a plurality of history matched models based on an iterative process of redefining the objective function; and
   ranking the plurality of history matched models based on misfits determined from the objective functions associated with each of the history matched models.

9. A non-transitory, computer-readable medium storing one or more instructions executable by a computer system to perform operations comprising:
   receiving a seismic dataset of a surveyed subsurface, the seismic dataset comprising a set of parameters representing physical features of the surveyed subsurface;
   identifying a dynamic response of each parameter of the set of parameters, wherein each parameter of the set is associated with a range of values;
   selecting a subset of parameters from the set of parameters based on the dynamic response of each parameter;
   sampling an outer boundary of a parameter uncertainty domain, the parameter uncertainty domain based on the range of values for each parameter of the subset of parameters;
   adjusting the range of values associated with each parameter of the subset based on the sampling;
   generating a geo-model based on the adjusted range of values associated with each parameter of the subset;
   generating a discrete fracture network model based on the geo-model;
   generating a scenario of a simulation model based on the discrete fracture network model and the geo-model;
   performing a forward simulation based on the scenario of the simulation model;
   determining that a misfit of the forward simulation is below a threshold by evaluating an objective function;
   producing a three-dimensional (3D) model based on the forward simulation;
   in response to determining that the misfit of the forward simulation is not below the threshold:
   redefining the objective function by an assisted history matching process in which a new parameter uncertainty domain is sampled for each of the geo-model, the discrete fracture network model, and the scenario of a simulation model; and
   generating a history matched model based on the redefined objective function.

10. The non-transitory, computer-readable medium of claim 9, wherein identifying a dynamic response of one or more parameters of the set of parameters comprises:
    assigning one or more of a tolerance value range and a probability sampling distribution to each parameter of the set of parameters based on the uncertainty domain associated with each parameter;
    determining a sensitivity metric for each of the parameters based on the one or more of the tolerance value range and the probability sampling distribution of each of the parameters;
    ranking the parameters of the set of parameters based on the sensitivity metric associated with each of the parameters; and
    selecting, from the set of the parameters, the subset of parameters including one or more higher ranked parameters, the one or more higher ranked parameters representing higher contribution to the dynamic response of the fractured reservoir model than one or more lower ranked parameters of the set of parameters.

11. The non-transitory, computer-readable medium of claim 10, wherein assigning the one or more of the tolerance value range and the probability sampling distribution is based on selected types of basin geology and sedimentology associated with the seismic dataset.

12. The non-transitory, computer-readable medium of claim 9, wherein the set of parameters is selected from a group consisting of permeability, porosity, fracture density, fracture intensity, fracture geometry, fracture aperture, fracture orientation, stress, pore pressure, fluid contacts, fault transmissibility, a vertical to horizontal permeability Kv/Kh) ratio, fluid properties, and aquifer strength.

13. The non-transitory, computer-readable medium of claim 9, wherein generating the scenario of a simulation model based on the discrete fracture network model and the geo-model comprises:
    defining uncertainty tolerance range of fluid contacts in the simulation model;
    defining uncertainty tolerance range of fault transmissibility in the simulation model;
    defining uncertainty tolerance range of a vertical to horizontal permeability (Kv/Kh) ratio in the simulation model;
    defining uncertainty tolerance range of fluid properties (PVT) in the simulation model;
    defining uncertainty tolerance range of aquifer strength in the simulation model; and
    defining uncertainty tolerance range of external fluxes in the simulation model.

14. The non-transitory, computer-readable medium of claim 9, further comprising generating a plurality of history matched models based on an iterative process of redefining the objective function; and
    ranking the plurality of history matched models based on misfits determined from the objective functions associated with each of the history matched models.

15. A computer-implemented system, comprising:
    a computer memory; and
    a hardware processor interoperably coupled with the computer memory and configured to perform operations comprising:

receiving a seismic dataset of a surveyed subsurface, the seismic dataset comprising a set of parameters representing physical features of the surveyed subsurface;

identifying a dynamic response of each parameter of the set of parameters, wherein each parameter of the set is associated with a range of values;

selecting a subset of parameters from the set of parameters based on the dynamic response of each parameter;

sampling an outer boundary of a parameter uncertainty domain, the parameter uncertainty domain based on the range of values for each parameter of the subset of parameters;

adjusting the range of values associated with each parameter of the subset based on the sampling;

generating a geo-model based on the adjusted range of values associated with each parameter of the subset;

generating a discrete fracture network model based on the geo-model;

generating a scenario of a simulation model based on the discrete fracture network model and the geo-model;

performing a forward simulation based on the scenario of the simulation model;

determining that a misfit of the forward simulation is below a threshold by evaluating an objective function;

producing a three-dimensional (3D) model based on the forward simulation;

in response to determining that the misfit of the forward simulation is not below the threshold:
redefining the objective function by an assisted history matching process in which a new parameter uncertainty domain is sampled for each of the geo-model, the discrete fracture network model, and the scenario of a simulation model; and generating a history matched model based on the redefined objective function.

16. The computer-implemented system of claim 15, wherein identifying a dynamic response of one or more parameters of the set of parameters comprises:

assigning one or more of a tolerance value range and a probability sampling distribution to each parameter of the set of parameters based on the uncertainty domain associated with each parameter;

determining a sensitivity metric for each of the parameters based on the one or more of the tolerance value range and the probability sampling distribution of each of the parameters;

ranking the parameters of the set of parameters based on the sensitivity metric associated with each of the parameters; and selecting, from the set of the parameters, the subset of parameters including one or more higher ranked parameters, the one or more higher ranked parameters representing higher contribution to the dynamic response of the fractured reservoir model than one or more lower ranked parameters of the set of parameters.

17. The computer-implemented system of claim 16, wherein assigning the one or more of the tolerance value range and the probability sampling distribution is based on selected types of basin geology and sedimentology associated with the seismic dataset.

18. The computer-implemented system of claim 15, wherein the set of parameters is selected from a group consisting of permeability, porosity, fracture density, fracture intensity, fracture geometry, fracture aperture, fracture orientation, stress, pore pressure, fluid contacts, fault transmissibility, a vertical to horizontal permeability (Kv/Kh) ratio, fluid properties, and aquifer strength.

19. The computer-implemented system of claim 15, wherein generating the scenario of a simulation model based on the discrete fracture network model and the geo-model comprises:

defining uncertainty tolerance range of fluid contacts in the simulation model;

defining uncertainty tolerance range of fault transmissibility in the simulation model;

defining uncertainty tolerance range of a vertical to horizontal permeability (Kv/Kh) ratio in the simulation model;

defining uncertainty tolerance range of fluid properties (PVT) in the simulation model;

defining uncertainty tolerance range of aquifer strength in the simulation model; and defining uncertainty tolerance range of external fluxes in the simulation model.

20. The computer-implemented system of claim 15, further comprising generating a plurality of history matched models based on an iterative process of redefining the objective function; and ranking the plurality of history matched models based on misfits determined from the objective functions associated with each of the history matched models.

* * * * *